United States Patent [19]

Minami et al.

[11] Patent Number: 5,371,023
[45] Date of Patent: Dec. 6, 1994

[54] GATE CIRCUIT, SEMICONDUCTOR INTEGRATED CIRCUIT DEVICE AND METHOD OF FABRICATION THEROF, SEMICONDUCTOR MEMORY AND MICROPROCESSOR

[75] Inventors: Masataka Minami; Mitsuru Hiraki, both of Hachioji; Kazuo Yano, Hino; Atsuo Watanabe, Hitachiota; Kouichi Seki, Hino; Takahiro Nagano, Hitachi; Kazushige Sato, Ome; Keiichi Yoshizumi; Ryuichi Izawa, both of Kokubungi, all of Japan

[73] Assignee: Hitachi, Ltd., Tokyo, Japan

[21] Appl. No.: 895,815

[22] Filed: Jun. 9, 1992

[30] Foreign Application Priority Data

Jun. 11, 1991 [JP] Japan ................................. 3-138807
Sep. 12, 1991 [JP] Japan ................................. 3-233317

[51] Int. Cl.$^5$ ................................. H01L 21/20
[52] U.S. Cl. ................................. 437/35; 437/26; 437/27; 437/32; 437/31; 437/34; 437/59; 437/76
[58] Field of Search ............ 437/27, 32, 35, 76, 437/26, 34, 31, 59

[56] References Cited

U.S. PATENT DOCUMENTS

| | | | |
|---|---|---|---|
| 4,965,216 | 10/1990 | Scovell et al. | 437/32 |
| 4,985,367 | 1/1991 | Takada | 437/32 |
| 5,006,476 | 4/1991 | DeJong et al. | 437/32 |
| 5,066,602 | 11/1991 | Takemoto et al. | 437/32 |
| 5,091,322 | 2/1992 | Maeda et al. | 437/31 |

FOREIGN PATENT DOCUMENTS

53-102669 9/1978 Japan ................................. 437/35

OTHER PUBLICATIONS

Wolf et al., "Silicon Processing for the VLSI ERA vol. 1: Process Technology", Lattice Press, 1986, pp. 292-293.
Wolf et al., "Silicon Processing for the VLSI ERA vol. 1: Process Technology", Lattcie Press, 1986, p. 321-323.

Primary Examiner—R. Bruce Breneman
Assistant Examiner—Ramamohan Rao Paladugu
Attorney, Agent, or Firm—Antonelli, Terry, Stout & Kraus

[57] ABSTRACT

A novel gate circuit is disclosed. A first semiconductor switch includes a couple of main terminals connected between a first potential level and an output node, in which a high impedance state is held in response to an input signal having a first logic level and a second logic level, and the impedance state changes from high to low only during a transient period when the input signal changes substantially from the first to second logic level. A second semiconductor switch includes a couple of main terminals inserted between a second potential level different from the first potential level and the output node, in which a high impedance state is held in response to the input signal, and the impedance state changes from high to low only during a transient period when the input signal changes from the second to first logic level.

13 Claims, 35 Drawing Sheets

SIMPLE COUPLED TYPE

DIODE COUPLED TYPE

VERTICALLY-SEPARATED TYPE

PULL-UP SECTION
INPUT
OUTPUT
PULL-DOWN SECTION

LOGIC SECTION
PULL-UP SECTION
OUTPUT
INPUT
PULL-DOWN SECTION

FIG. 17

LOGIC SECTION

| VERTICALLY-SEPARATED TYPE | INTEGRATED TYPE | | | | | |
|---|---|---|---|---|---|---|
| | SIMPLE COUPLED TYPE | | | | | RESISTOR COUPLING |
| | | SBD | PN JUNCTION | MOS USED | | |

PULL-DOWN SECTION

| DIRECT FEADBACK | | | | |
|---|---|---|---|---|
| RESISTOR TYPE | MOS TYPE | FEADBACK TYPE | | |
| | | DIRECT | INVERTER | COMPLEX |

| INBERTER FEADBACK | | | | |
|---|---|---|---|---|
| RESISTOR TYPE | MOS TYPE | FEADBACK TYPE | | |
| | | DIRECT | INVERTER | COMPLEX |

GATE CIRCUIT, SEMICONDUCTOR INTEGRATED CIRCUIT DEVICE AND METHOD OF FABRICATION THEROF, SEMICONDUCTOR MEMORY AND MICROPROCESSOR

CROSS-REFERENCE TO RELEVANT APPLICATIONS

The present application is relevant to U.S. Pat. No. 5,107,141, of which priority is based on Japanese Patent Applications of Serial No. 1-282,964 and Serial No. 2-157,503, entitled "BiCMOS Logic Circuit Using 0.5 $\mu$m Technology And Having An Operating Potential Of Less Than 4 V" in the names of K. Yano et al. and the contents of which are incorporated herein by reference.

BACKGROUND OF THE INVENTION

The present invention relates to a gate circuit, a semiconductor integrated circuit device, a method of fabrication thereof, a semiconductor memory and a microprocessor, or more in particular to a BiCMOS gate circuit, a semiconductor integrated circuit device and a method of fabrication thereof, a semiconductor memory and a microprocessor suitable for operation with low voltage supply (low voltage source) and low consumption power.

The present invention also relates to a semiconductor integrated circuit device including at least a bipolar transistor having a high-concentration buried layer and a method of fabrication thereof.

A prior art system comprising at least a bipolar transistor combined with a MOS transistor is disclosed in IEEE Journal of Solid-State Circuits, Vol. 26, 1991, pp. 150 to 153.

Also, the prior art systems relating to a semiconductor integrated circuit include JP-A-54-67384 and U.S. Pat. No. 4,862,240.

A prior art system relating to a semiconductor integrated circuit device having at least a bipolar transistor is disclosed, for example, in "Nikkei Micro Device", February 1990, pp. 53 to 54, published by Nikkei McGRAW-HILL. According to this system, an integrated circuit device having a bipolar transistor generally comprises an NPN transistor, for example, in which N+ ions constituting the collector thereof are partially buried in the substrate, and P+ ions are buried in such an arrangement as to surround the N+ ions to isolate them electrically from other devices.

SUMMARY OF THE INVENTION

An object of the present invention is to provide a BiCMOS gate circuit capable of high-speed, low-voltage operation, available in high integrity and suitable for operation with low power consumption, which can be operated even with a very small MOSFET of 0.5 microns or less.

Another object of the present invention is to provide a semiconductor integrated circuit most suitable for producing the above-mentioned gate circuit device, small in the parasitic capacitance of the collector, stable in operation, and including a bipolar transistor and a MOSFET in harmony with simple processes.

Still another object of the present invention is to provide a semiconductor integrated circuit device such as a semiconductor memory using the above-mentioned gate circuit capable of high-speed operation with a low supply voltage and also capable of operation with low power consumption.

A further object of the present invention is to provide a semiconductor integrated circuit device and a method of fabrication thereof which is capable of realizing both a high integrity and high speed.

The prior systems of a BiCMOS circuit described above take the operation at a low supply voltage into consideration. Since the charges accumulated in the base of a bipolar transistor fails to be released until the input is switched, however, the particular bipolar transistor remains in a low impedance until the input is switched, thus requiring considerable time before the bipolar transistor is changed from low to high impedance. As a result, both pull-up and pull-down bipolar transistors remain in a low-impedance state and a through current escapes to the ground from the power supply temporarily resulting in an increased power consumption at the time of input switching. In addition, the problem of a lower speed is posed.

The conventional semiconductor integrated circuit described above uses a trench isolation in order to reduce the parasitic capacitance. Nevertheless, the trench structure using trenches of two different depths requires at least two cycles of trench processing steps including photolithography, dry etching and filling up of insulating material, thereby complicating the fabrication processes. Also, the direct contact between an N-type burial layer of high concentration and a high-concentration layer of the collector increases the parasitic capacitance of the particular part. This offsets the effect of reducing the side parasitic capacitance by trench isolation, thus making it impossible to reduce the parasitic capacitance against expectation.

The present invention is intended to solve this problem of the prior art.

In order to achieve the above-mentioned objects, according to the present invention, there is provided a gate circuit comprising a first semiconductor switch having a couple of main terminals connected between a first potential level and an output node and maintaining a high impedance state in response to an input signal having a first logic level and a second logic level, the first semiconductor switch changing to a low-impedance state only during a transient period when the input signal changes substantially from a first to a second logic level, and a second semiconductor switch including a couple of main terminals inserted between a second potential level different from the first potential level and an output node, the second semiconductor switch maintaining a high impedance state in response to the input signal and changing to a low impedance state only during a transient period when the input signal changes substantially from the second logic level to the first logic level.

Further, according to the present invention, there is provided a gate circuit comprising a first bipolar transistor having a emitter-collector circuit connected between a first potential level and an output node, a second bipolar transistor with a emitter-collector circuit inserted between a second potential level and the output node, at least a first field effect transistor with a source-drain circuit connected between a third potential level and the base of the first bipolar transistor and responsive to an input signal, a second field effect transistor with a source-drain circuit inserted between the third potential level and the base of the first bipolar transistor and connected in series with the source-drain circuit of the first field effect transistor, the second field effect transistor being responsive to a signal of the output node, at least a third field effect transistor with a source-drain circuit inserted between a fourth potential level and the base of the second bipolar transistor and responsive to the input signal, the third field effect transistor being of a conduction type different from that of the first field effect transistor, and a fourth field effect transistor having a source-drain circuit inserted between the fourth potential and the base of the second bipolar transistor in series with the source-drain circuit of the third field effect transistor, the fourth field effect transistor being responsive to the signal of the output node and being of a conduction type different from that of the second field effect transistor.

According to the present invention, in steady state, both the pull-up and pull-down bipolar transistors are in high impedance state, and only one of the two bipolar transistor changes to low impedance state during a transient period when the input signal undergoes a change. After the transient period, the bipolar transistor which has thus far been in low impedance state rapidly changes to a high impedance state.

Further, the collector of the above-mentioned gate circuit provides an output thereof. Therefore, what is called a trench isolation is used for the bipolar transistor section to minimize the collector capacitance. Also, a device structure and a fabrication method are employed in which an NPN transistor coexists with a PNP transistor, and in order to simplify the processes, the depth of the trench for isolation is such as to pierce through the collectors of the NPN transistor and the PNP transistor and reach midway of the buried layer for insulating the collector and substrate of the PNP transistor.

Furthermore, in order to produce a semiconductor memory capable of operation with a low supply voltage and low power consumption at high speed, the above-mentioned gate circuit is employed for the word driver, input-output buffer and the decoder of the semiconductor memory.

In addition, in order to produce a microprocessor capable of operation with a low supply voltage, a low power consumption and at high speed, the above-mentioned gate circuit is included in a microprocessor.

According to the present invention, a current continues to be supplied to the base until an output voltage reaches a full amplitude, and subsequently the base current ceases to be supplied, thereby making an operation possible with a low supply voltage and a low power consumption.

Further, in a discharge operation according to the present invention, a pMOS transistor charges the base of an NPN transistor. In the process, in view of the on voltage (about 0.8 V) between the base and emitter of the NPN transistor, the drain-source voltage of the pMOS drops. Since the drain current of a MOSFET is substantially independent of the drain-source voltage, however, the drain current decrease due to the voltage loss is small. As a result, the pMOS transistor is capable of charging the base of the NPN transistor rapidly even under a low voltage, thereby making a high-speed operation possible even under a low voltage. This is also the case with the charging operation.

Furthermore, according to the present invention, both pull-up and pull-down transistors do not change to a low impedance state. Therefore, there flows no through current, thus making an operation possible with a low power consumption.

Further, what is called the trench isolation is used with a bipolar transistor section to minimize the collector capacitance, so that the parasitic capacitance is minimized making a high-speed circuit operation possible. Especially, in a gate circuit according to the present invention, the collector provides an output with a reduced capacitance of the output. This is an effect further improving the speed. Also, the device structure and the fabrication method are such that the depth of the trench pierces through the collectors of the NPN and PNP transistors and reach midway of a buried layer isolating the collector and substrate of the PNP transistor. As a result, even if the trench depth for isolation is limited to one type and the trench is formed in a single process, high-performance NPN and PNP transistors can be made to coexist.

Furthermore, the use of a word drive, an input-output driver and a decoder for a semiconductor memory provides a semiconductor memory capable of operation with a low supply voltage and a low power consumption with a high speed. Especially, in the conventional BiCMOS gate circuits in which the output fails to reach a full amplitude, a CMOS circuit is used in the final stage of a word driver for driving a memory cell word line. The gate circuit according to the present invention, on the other hand, is capable of full output amplitude, and therefore may be used in the final stage of a word driver. Since a word line can be driven with a bipolar transistor with a large driving force, a high-speed memory is produced.

Furthermore, by using the above-mentioned gate circuit with a microprocessor, it is possible to produce a microprocessor capable of operation with a low supply voltage and a low power consumption at high speed.

As explained above, according to the present invention, the driving force is not reduced due to the voltage Vbe of a bipolar transistor, and a BiCMOS gate circuit is realized which can operate at high speed even under a low voltage of 2 V or less at which conventional BiCMOS gate circuits cannot operate at all. This feature of the possibility of operation under a low voltage makes it possible to use a MOSFET transistor processed finely to, say, 0.5 microns, thereby realizing a remarkable high integration. According to the present invention, a high-performance BiCMOS device is produced with a simplified production process, and therefore a BiCMOS gate circuit capable of high-speed operation even with a low voltage is realized easily with a low price. Also, according to the present invention, a high-speed memory and microprocessor with a low power consumption are realized, thereby greatly contributing to an improved device speed and a reduced size and power consumption. Especially, portable equipment using a 1.5 V battery can be improved in speed and reduced in power consumption. Thus a very high industrial value is achieved.

Also, it is possible to provide a semiconductor integrated circuit device and a method of fabrication thereof which realize both a high speed and high integration of a bipolar transistor to which the present invention is applicable.

As disclosed in "Nikkei Micro Devices", February 1990, pp. 53 to 54, for example, the structure of a buried layer according to the prior art is roughly divided into two types. In one type, N+ and P+ ions are prepared by self-aligning, and form a PN junction directly. In the other type, P+ ions are produced in a desired area with a photoresist as a mask, so that N+ and P+ ions are not adapted to form a PN junction directly.

The former structure of the prior art in which a PN junction is formed by self-aligning is suited for high integration. Since N+ and P+ ions of high concentration form a PN junction, however, the junction capacity is increased, thereby increasing the parasitic capacitance of the collector and the substrate of a bipolar transistor. This lacks a consideration for improving the speed of an integrated circuit device.

The latter structure, on the other hand, in which N+ and P+ ions of high concentration are not adapted to form a PN junction, can keep the parasitic capacitance low. Thus this structure is suitable for improving the speed. In spite of this, N+ and P+ ions are required to be isolated from each other taking an alignment margin into consideration in view of the fact that a P+ region is prepared with a photoresist as a mask. Thus this results in a lack of consideration for an improved integration.

Explanation will be made about a semiconductor integrated circuit device and a method of fabrication thereof according to the present invention which can realize both a high integrity and a high speed at the same time. In order to achieve the above-mentioned objects, according to the present invention, there is provided a semiconductor integrated circuit device comprising a bipolar transistor with a substrate deposited with an N+ buried layer thereon and an N-type region on the N+ buried layer and a field oxide film for isolating adjacent bipolar transistors from each other, wherein the concentration gradient of the impurities concentration distribution at a junction between the N+ buried layer making up the collector of the bipolar transistor and the P+ buried layer surrounding the N+ buried layer in a direction perpendicular to the particular junction at one of the buried layers, is configured of two stages high and low in concentration, while at the same time forming a PN junction between the region of lower distribution of concentration and the other buried layer.

Also, according to the present invention, there is provided a semiconductor integrated circuit device comprising a bipolar transistor, an N-channel MOS transistor and a P-channel MOS transistor. The bipolar transistor has a substrate deposited with an N+ buried layer thereon, on which is further deposited an N-type region. The N-channel MOS transistor has the substrate thereof deposited with a P+ buried layer which is further deposited thereon with a P-type region. The P-channel MOS transistor, on the other hand, has the substrate thereof deposited with an N+ buried layer, further deposited thereon with an N-type region. The semiconductor integrated circuit device includes a field oxide film for isolating the bipolar transistor, the N-channel MOS transistor and the P-channel MOS transistor from each other. The concentration gradient of distribution of impurities concentration at the junction between the N+ buried layer making up the collector of the bipolar transistor and P+ buried layer surrounding the N+ buried layer in a direction perpendicular to the junction at one of the buried layers, is configured of two stages of high and low concentrations, while at the same time forming a PN Junction between the region of lower concentration distribution and the other buried layer.

Further, according to the present invention, an isoplanar type of semiconductor integrated circuit device is configured in the same way as mentioned above.

According to still another aspect of the present invention, there is provided a method of fabricating a semiconductor integrated circuit device, comprising a first step of forming a thermal oxide film on a silicon substrate and a nitride film thereon, a second step of coating a photoresist and removing the resist from an area where an N+ buried layer is to be formed, a third step of implanting impurities as ions for forming the region from which the resist has been removed into either an N+ or P+ buried layer, and a fourth step of implanting the same impurities as the above-mentioned ones as ions with a concentration lower than in the implantation at the third step from the direction at an angle to the silicon substrate.

According to a further aspect of the present invention, there is provided a method of fabricating a semiconductor integrated circuit device, comprising a first step of forming a thermal oxide film on a silicon substrate and a nitride film thereon, a second step of coating a photoresist and removing the photoresist from an area where an N+ buried layer is to be formed, a third step of implanting ions as impurities for forming an area from which the photoresist has been removed into either an N+ buried layer or a P+ buried layer, a fourth step of implanting the same impurities as the above-mentioned ones in a concentration lower than in step 3 at an angle to the silicon substrate, a fifth step of removing the remaining resist, selectively oxidizing the remaining nitride film with a mask to remove it and implanting borons for forming a P+ buried layer using an oxide film generated by selective oxidization as a mask, a sixth step of removing the oxide film by wet etching and causing epitaxial growth of a single crystal silicon, a seventh step of forming an N-type region in an area formed with the bipolar transistor and the P-channel MOS transistor, and a P-type region in an area formed with the N-channel MOS transistor, and eighth step of forming a field oxide film to isolate the bipolar transistor, the P-channel MOS transistor and N-channel MOS transistor from each other and then forming an N+ region for securing a collector electrode of the bipolar transistor.

According to the above-described configuration, the distribution of the lower of the two stages of concentration gradients forms a PN junction with the other buried layer, and therefore the depletion layer of the PN junction extends thereby reducing the junction capacitance. As a result, the parasitic capacitance of the collector and substrate of a bipolar transistor can be reduced, thereby attaining a higher speed and integrity of a semiconductor integrated circuit device.

As explained above, according to the present invention, the junction capacitance of the PN junction formed between N+ providing the collector of a bipolar transistor and P+ surrounding the N+ is reduced. Thus the parasitic capacitance of the collector of the bipolar transistor and substrate thereof is also reduced, thereby making it possible to achieve an improved integrity and an increased speed of a semiconductor integrated circuit device.

BRIEF DESCRIPTION OF THE DRAWINGS

FIG. 17 is a diagram showing a configuration of still another gate circuit providing a representative example of circuit configuration of a further gate circuit according to the present invention.

DESCRIPTION OF THE PREFERRED EMBODIMENTS

An embodiment of the present invention will be explained below with reference to the accompanying drawings.

Figure 1:
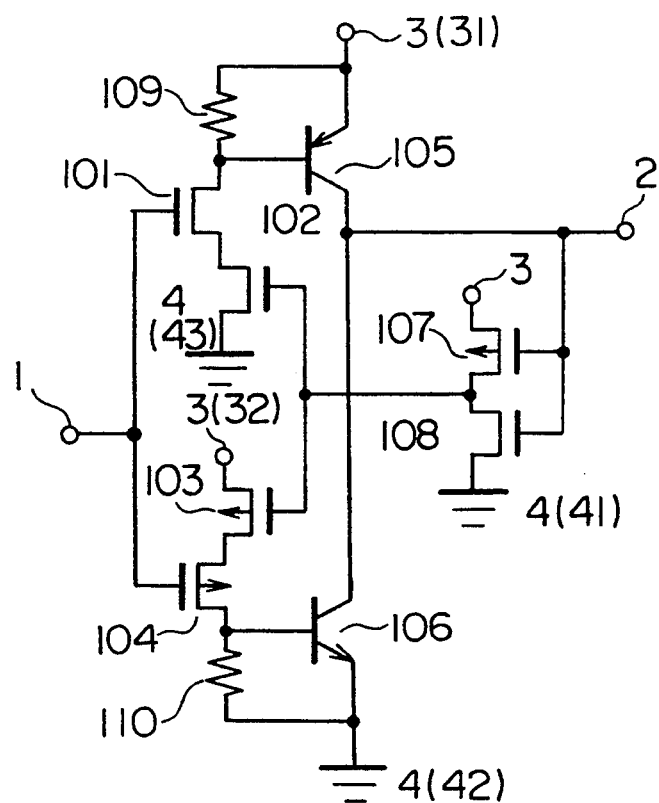
FIG. 1 is a diagram showing a configuration of a gate circuit according to an embodiment of the present invention.

FIG. 1 is a diagram showing a configuration of a BiCMOS gate circuit according to an embodiment of the present invention.

Reference numeral 1 designates an input terminal, numeral 2 an output terminal, numeral 3 a terminal connected to a supply voltage level, and numeral 4 (41, 42, 43) a terminal connected to another supply voltage level. This terminal is shown in FIG. 1 as an example connected to a ground potential level (hereinafter referred to simply as "GND"). These terminals may be set to different supply voltage levels. Numeral 101, 102, 108 designate an nMOS transistor (hereinafter referred to simply as "nMOS"), numerals 103, 104, 107 a pMOS transistor (hereinafter referred to as "pMOS"), numeral 105 a PNP transistor, numeral 106 NPN transistor, and numerals 109 and 110 resistors.

nMOS 101 and 102 are devices for controlling the connection between the base of the PNP transistor 105 and GND. pMOS 103 and 104 designate an element for controlling the connection between the base of the NPN transistor 106 and the supply voltage terminal. The PNP transistor 105 is for charging a capacitive load connected to the output. The NPN transistor 106 is for releasing the charges from a capacitive load, a resistor 109 for charging the base charges of the PNP transistor 105, a resistor 110 for releasing base charges from the NPN transistor 106, and pMOS 107 and nMOS 108 act as an inverter for feeding back the reverse signal of the output.

This gate circuit comprises a PNP transistor 105 making up a first bipolar transistor with the emitter-collector circuit thereof connected between a first potential level 3(31) and an output node 2, an NPN transistor making up a second bipolar transistor with the emitter-collector circuit thereof connected between a second potential level 4(42) and an output node 2, an nMOS 101 transistor making up at least a first field effect transistor with the source-drain circuit thereof connected between a third potential level 4(43) and the base of the PNP transistor 105 and responsive to an input signal applied to the input terminal 1, an nMOS 102 transistor making up a second field effect transistor with the source-drain circuit thereof connected between the third potential level 4(43) and the base of the PNP transistor 105 in series with the source-drain circuit of the nMOS 101 transistor and responsive to the signal of an output node through a CMOS inverter circuit including pMOS 107 and nMOS 108, a pMOS 104 transistor making up at least a third field effect transistor with the source-drain circuit thereof connected between a fourth potential level 3(32) and the base of the NPN transistor 106 and responsive to the input signal applied to the input terminal 1, a pMOS 103 transistor making up a fourth field effect transistor with the source-drain circuit thereof connected in series with the source-drain circuit of pMOS 104 between the fourth potential level 3(32) and the base of the NPN transistor 106 and responsive to the signal of an output node through a CMOS inverter circuit including pMOS 107 and nMOS 108, and a first resistor 109 inserted between the base and emitter of the PNP transistor 105 and the first potential level 3(31), a second resistor 110 connected between the base and emitter of the NPN transistor 106 and the second potential level 4(41).

More specifically, the above-mentioned gate circuit comprises a PNP transistor 105 making up a first bipolar transistor with the collector thereof of one conductivity type connected to the output node 2 and the emitter thereof of the other conduction type connected to the first potential level 3(31), and including the base of the other conductivity type, an NPN transistor making up a second bipolar transistor with the collector thereof of the other conductivity type connected to the output node 2 and the emitter of the other conductivity type connected to the second potential level 4(42), and including the base of one conductivity type, an nMOS 101 with the source-drain circuit thereof connected between the third potential level 4(43) and the base of the PNP transistor 105 and making up at least a first field effect transistor of the other conductivity type responsive to an input signal, an nMOS 102 with the source-drain circuit thereof connected between the third potential level 4(43) and the base of the PNP transistor 105 in series with the source-drain circuit of nMOS 101 and making up a second field effect transistor of the other conductivity type responsive to the signal of the output node 2 through a CMOS inverter circuit including pMOS 107 and nMOS 108, a pMOS 104 with the source-drain circuit thereof inserted between the fourth potential level 3(32) and the base of the NPN transistor 106 and making up at least a first field effect transistor of one conductivity type responsive to an input signal, a pMOS 103 with the source-drain circuit thereof connected between the fourth potential level 3(32) and the base of the NPN transistor 106 in series with the source-drain circuit of pMOS 104 and making up a second field effect transistor of one conductivity type responsive to a signal of the output node 2 through a CMOS inverter circuit formed of pMOS 107 and nMOS 108, a first resistor 109 connected between the base and emitter of the PNP transistor 105 and the first potential level 3, and a second resistor 110 connected between the base and emitter of the NPN transistor 106 and the second potential level 4.

As viewed from a different point, the gate circuit shown in FIG. 1 comprises a PNP transistor 105 making up a first semiconductor switch with a couple of main terminals inserted between the first potential level 3 and the output node 2, responsive to an input signal having a first logic level and a second logic level, and kept in a high impedance state and changes to a low impedance state only during a transient period when the input signal changes substantially from first to second logic level, and an NPN transistor 106 making up a second semiconductor switch with a couple of main terminals connected between the second potential level 4 different from the first potential level 3 and the output node 2, responsive to an input signal, kept in a high impedance state, and changes to a low impedance state only during a transient period when the input signal changes substantially from second to first logic level.

The operation of the gate circuit shown in FIG. 1 will be described in detail with reference to FIG. 1.

First, assume that the input signal is at low level. pMOS 104 is on, and nMOS 101 is off. If the output is at high level, a low-level signal fed back by a CMOS inverter including pMOS 107 and pMOS 108 is applied to the gates of pMOS 103 and nMOS 102, thereby turning on pMOS 103 and off nMOS 102. As a result, current begins to flow between the base of the NPN transistor 106 and a supply voltage terminal 3, and the NPN transistor 106 is turned on with a low impedance, thereby strongly releasing the charges of a capacitive load not shown connected to the output terminal 2. In the process, the PNP transistor 105 is turned off to a high impedance state. As long as pMOS 103 and pMOS 104 remain on, current continues to be supplied to the base of the NPN transistor 106 from the source potential level 3, and therefore the output voltage drops rapidly almost to the GND level 4. With the decrease of the voltage of the output node 2 to about the GND level 4, the PN junction between the collector and base is biased in forward direction, so that the driving current of the NPN transistor 106 ceases to flow, thereby stopping the drop of the voltage of the output node 2. Thus a low level in this gate circuit substantially coincides with the GND level 4.

Once the output voltage reaches a low level, a high-level signal with an output reversed through the CMOS inverter including pMOS 107 and nMOS 108 is fed back to the gates of pMOS 103 and pMOS 102. pMOS 103 is turned off. The base of the NPN transistor 106 is disconnected from the power supply, and the NPN transistor 106 changes to a high impedance state. As a consequence, there is no route where a DC current flows after the switching operation, and power consumption remains as low as a CMOS gate circuit. Also, the charges stored in the base of the NPN transistor 106 are released through the resistor 110 after the switching operation. Assuming that a capacitor of appropriate capacity is connected to the gate terminal of pMOS 103, the delay time before feedback of the reversed signal of output is increased, and the resulting increase in total charges flowing into the NPN transistor 106 from the supply voltage terminal strengthens the driving force of the NPN transistor 106.

Now, when the input changes to high level, a similar switching operation is caused due to the circuit configuration symmetry, and the output rapidly changes to a high level substantially equal to the supply voltage. In other words, if an input signal is at high level, pMOS 104 is off and nMOS 101 on. Assuming that the output is at low level, on the other hand, the high-level signal fed back by the CMOS inverter including pMOS 107 and nMOS 108 is applied to the gates of pMOS 103 and nMOS 102. Thus pMOS 103 is turned off, and nMOS 102 turned on. As a result, current begins to flow between the base of the PNP transistor 105 and the GND level 4, with the result that the PNP transistor 105 turns on in low impedance state, and the capacitive load not shown connected to the output terminal 2 is strongly charged. In the process, the NPN transistor 106 turns off in high impedance state. As long as nMOS 101 and nMOS 102 remain on, current continues to flow between the GND level 4 and the base of the PNP transistor 105, and therefore the output voltage rises rapidly almost to the supply potential level 3. When the voltage of the output node 2 rises to about the supply potential level 3, the PN junction between collector and base is biased in forward direction, and therefore the driving current of the PNP transistor 105 ceases to flow, thereby stopping the rise of the voltage across the output node 2. In this gate circuit, a high level substantially coincides with the supply potential level 3.

Once the output voltage reaches a high level, a low level signal with an output reversed through a CMOS inverter including pMOS 107 and nMOS 108 is fed back to the gates of pMOS 103 and nMOS 102. Since nMOS 102 turns off, the current between the base of the PNP transistor 105 and the GND level 4 is cut off and the PNP transistor 105 changes to high impedance state. As a result, there is no route available through which DC current can flow after the switching operation, thereby maintaining a low power consumption characteristic as low as in a CMOS gate circuit. Also, the charges stored in the base of the PNP transistor 105 are released through the resistor 109 after the switching operation. By the way, if a capacitor of appropriate magnitude is connected to the gate terminal of nMOS 102, the delay time before feedback of a reversed output signal is increased, so that the resulting increase in the total amount of charges of the current between the base of the PNP transistor 105 and the GND level 4 strengthens the driving force of the PNP transistor 105.

As will be obvious from the foregoing description, the gate circuit according to the present embodiment constitutes a non-reversal logic. A reversal logic can also be realized by inserting a CMOS logic section between the gates of nMOS 101, nMOS 104 and the input terminal 1, however, it is possible to form a desired logic by use of a gate circuit according to the present invention. A method of configuring a reversal logic will be described in detail with reference to another embodiment shown in FIG. 9.

Figure 2:
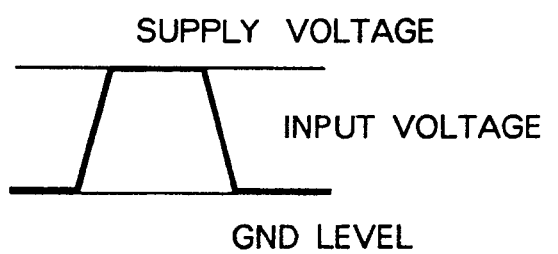
FIG. 2 is a diagram showing an operation of a gate circuit according to another embodiment of the present invention.
Figure 2:
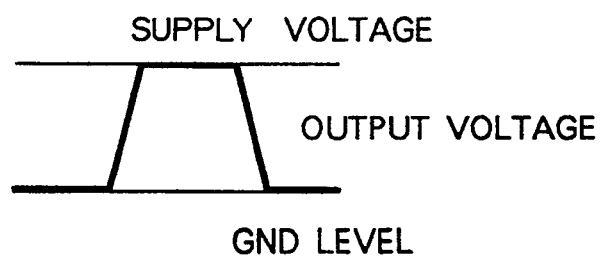

As explained above, a gate circuit according to an embodiment of the present invention has the feature in that the substantial coincidence between a high level and a supply voltage and between a low level and the GND level leads to a full amplitude (swing) operation as shown in FIG. 2. As a result, a supply voltage is fully applied between the gate and source of nMOS 101 and pMOS 104 for driving the bipolar transistors 105 and 106 respectively.

Figure 3:
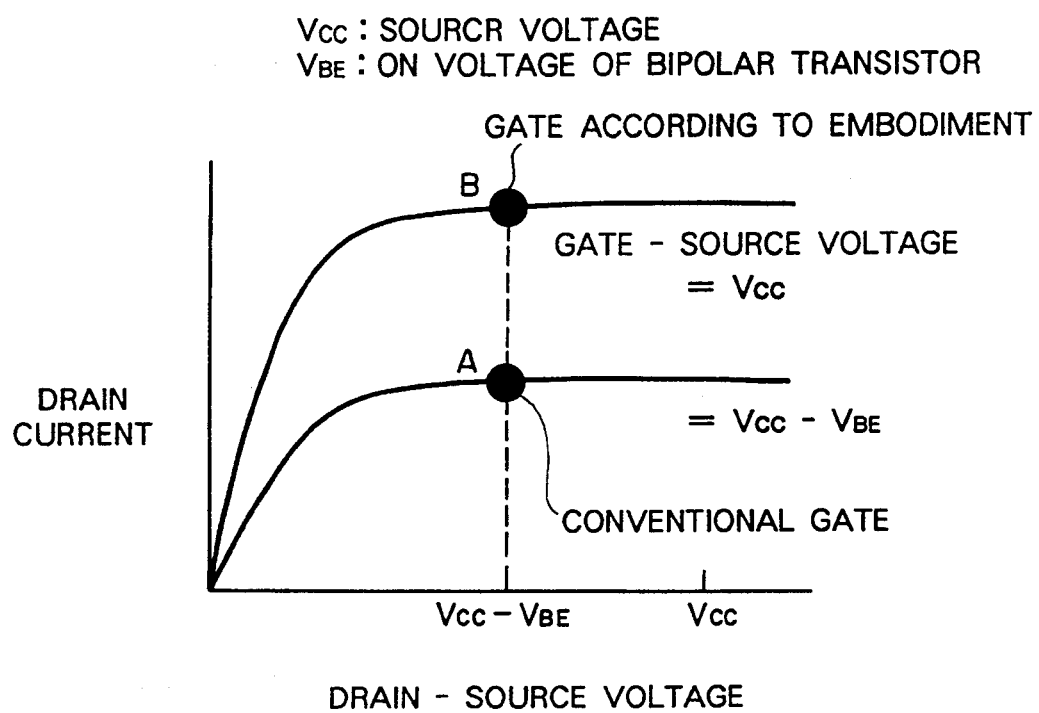
FIG. 3 shows a current/voltage characteristic of a MOSFET transistor.

Assume, for example, that a high-level signal is applied to the terminal 1. Since the output is at high level, a low-level signal is fed back to the gate of pMOS 103, thereby turning on pMOS 103. The source of pMOS 104 is thus connected through pMOS 103 to the supply voltage terminal 3. Now assume that the input changes to low level. Since the low level is equal to GND level, a voltage equal to the supply voltage is applied between the gate and supply of pMOS 103. The operating point of pMOS 104 involved is indicated by dot B in FIG. 3. Upon the turning on of the NPN transistor 106, the base potential thereof increases by Vbe. The voltage applied between drain and source of pMOS 104 decreases by Vbe from the supply voltage. To the extent that a MOS operates in a saturation region, however, the dependency of the drain current on the drain-source voltage is negligibly small. As a result, according to the gate circuit of the present embodiment, the decrease in drain current attributable to Vbe which posed a problem in a conventional BiCMOS gate circuit is not caused, thereby making possible a high-speed switching operation even with a reduced supply voltage.

Also, unlike in conventional BiCMOS gate circuits in which the operation is impossible in principle with a supply voltage of less than 2 Vbe due to the fact that high and low levels are displaced from the supply voltage and the GND level respectively, the gate circuit according to the present embodiment shown in FIG. 1 is adapted to operate even with a supply voltage of less than 2 Vbe due to the full amplitude (swing) of an output voltage. If the supply voltage is more than Vbe, a bipolar transistor can be turned on. Therefore, the operation is possible in principle with a supply voltage of more than Vbe.

Figure 4:
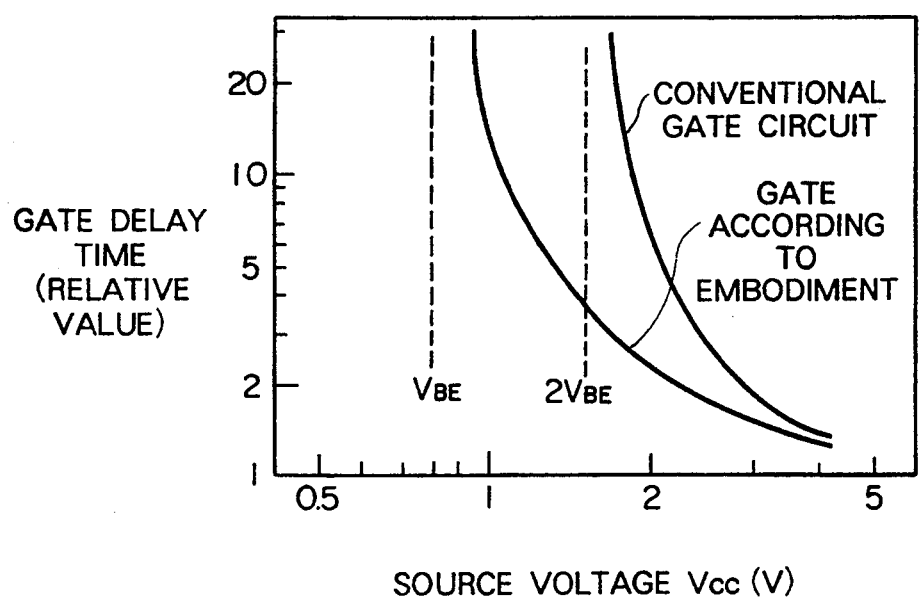
FIG. 4 shows a supply voltage dependency of a gate delay time.

FIG. 4 shows the dependence of the gate delay time on the supply voltage for BiCMOS gate circuits according to the present embodiment and the prior art. The decrease in the driving force attributable to Vbe occurs in the conventional BiCMOS gate circuit, but not in the BiCMOS gate circuit according to the present embodiment. For this reason, the gate circuit according to the present embodiment operates at higher speed than the conventional ones for all supply voltage values. In addition, the lower the supply voltage, the higher the speed of the gate circuit according to the present embodiment as compared with the conventional gate circuits. Also, the minimum critical voltage of gate circuit operation is reduced to Vbe from 2 Vbe for the conventional gate circuits. This fact is indicated in FIG. 4, in which an asymptotic line representing the gate delay time increasing infinitely is expressed as Vcc=2 Vbe for the conventional gate circuits, whereas it is given as Vcc=Vbe for the gate circuit according to the present invention.

Figure 5:
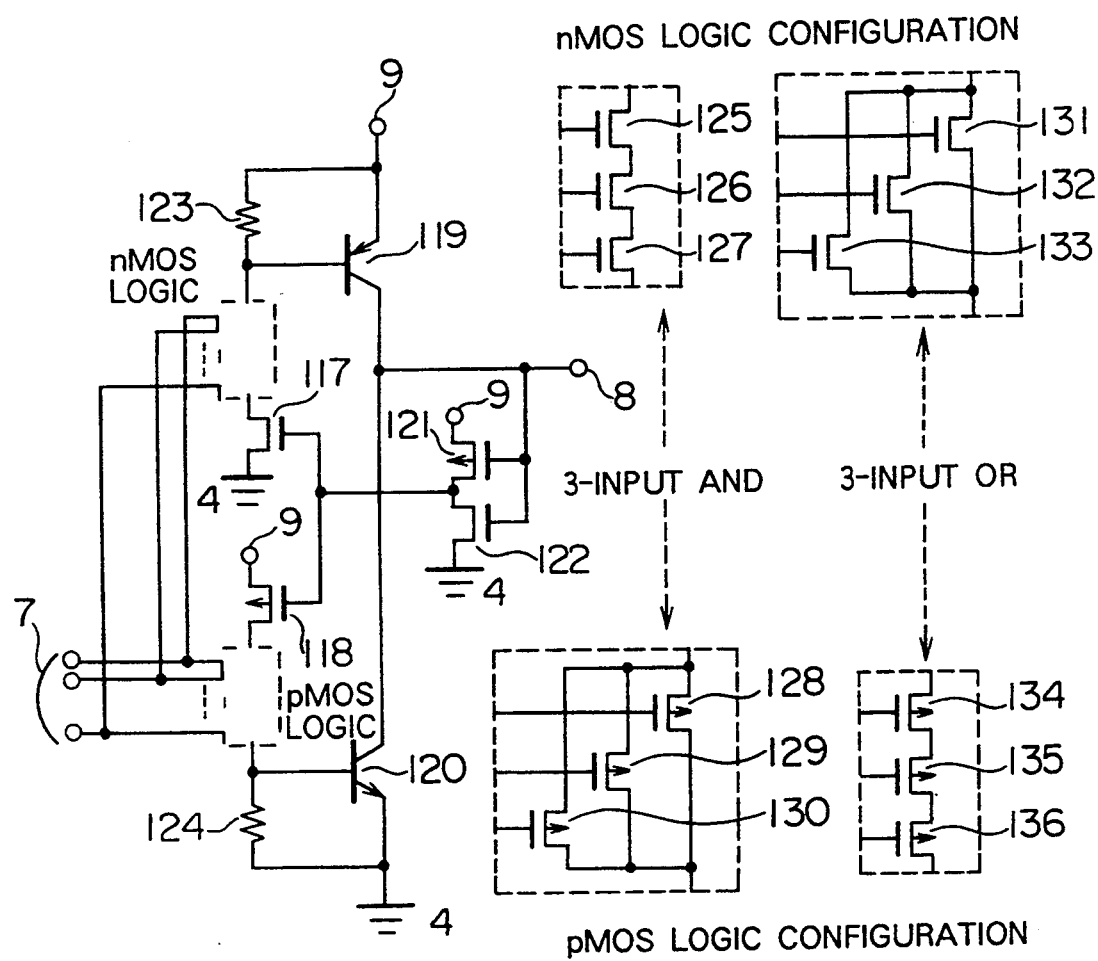
FIG. 5 is a diagram showing a configuration of a gate circuit according to another embodiment of the present invention.

A configuration of a gate circuit according to another embodiment of the present invention is shown in FIG. 5. This configuration comprises a three-input AND circuit and a three-input OR circuit as an example of a multi-input logic gate. Numeral 7 designates a plurality of input terminals, numeral 8 an output terminal, and numeral 9 a supply voltage terminal. Also, nMOSs 117, 122, pMOSs 118, 121, PNP transistor 119, NPN transistor 120, resistors 123, 124 function the same way as the nMOSs 102, 108, pMOSs 104, 107, PNP transistor 105, NPN transistor 106 and the resistors 109, 110, respectively. The nMOS and pMOS logic sections correspond to nMOS 101 and pMOS 104 in FIG. 1, respectively. These components make up a logic system including a plurality of nMOSs or pMOSs connected in series or in parallel, with the gate terminals of corresponding nMOS and pMOS connected to each other. The series connection of nMOSs 125, 126, 127 and the parallel connection of pMOSs 128, 129 and 130 represent the nMOS and pMOS logic sections respectively in a configuration of a three-input AND gate circuit. Also, the parallel connection of nMOSs 131, 132 and 133 and the series connection of pMOSs 134, 135 and 136 correspond to the nMOS and pMOS logic sections in a configuration of a three-input OR gate. The gate circuit operation of this circuit is substantially the same as in the embodiment of FIG. 1, and will not be described.

Figure 6:
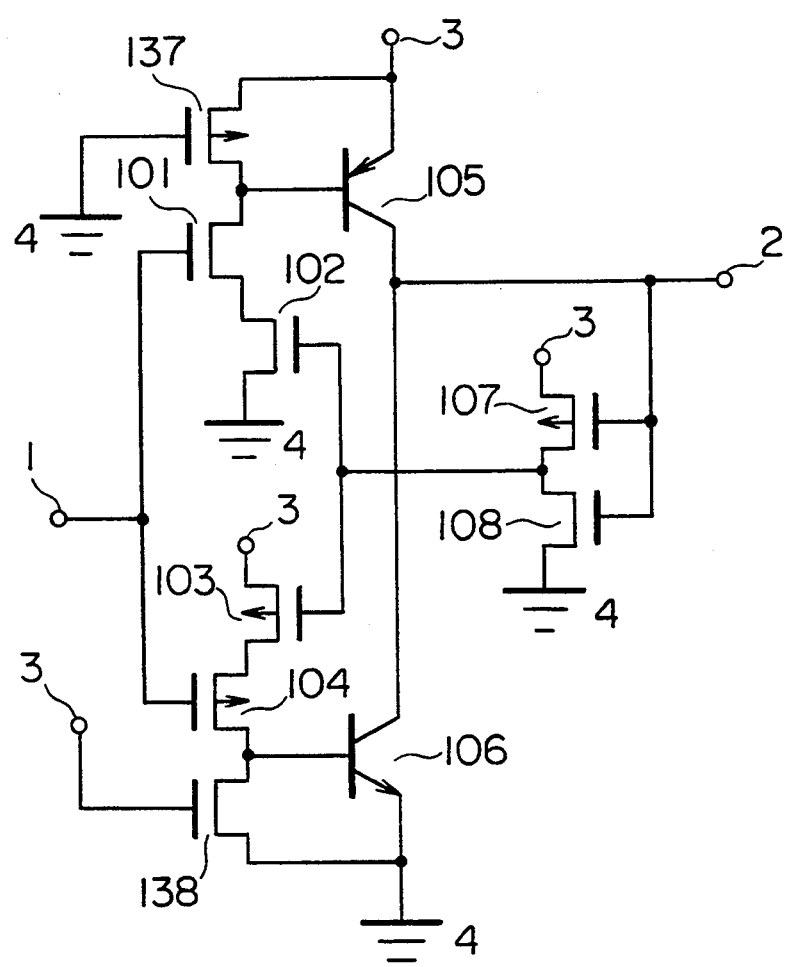
FIG. 6 is a diagram showing a general configuration of a gate circuit according to still another embodiment of the present invention.

A configuration of a gate circuit according to another embodiment of the present invention is shown in FIG. 6. According to the present embodiment, the resistors 109, 110 used in the embodiment shown in FIG. 1 are replaced by pMOS 137 with the gate thereof connected to GND 4 and an nMOS 138 with the gate thereof connected to the supply voltage 3. Generally, a MOS having a channel resistor equivalent to a resistor occupies a smaller area than the latter. The configuration according to the present embodiment, therefore, has the advantage of the gate circuit area being comparatively small. Also, the process of preparing a resistor can be omitted in production stages. The gate circuit operation of this embodiment is completely the same as that of the embodiment shown in FIG. 1 and therefore will not be described.

Figure 7:
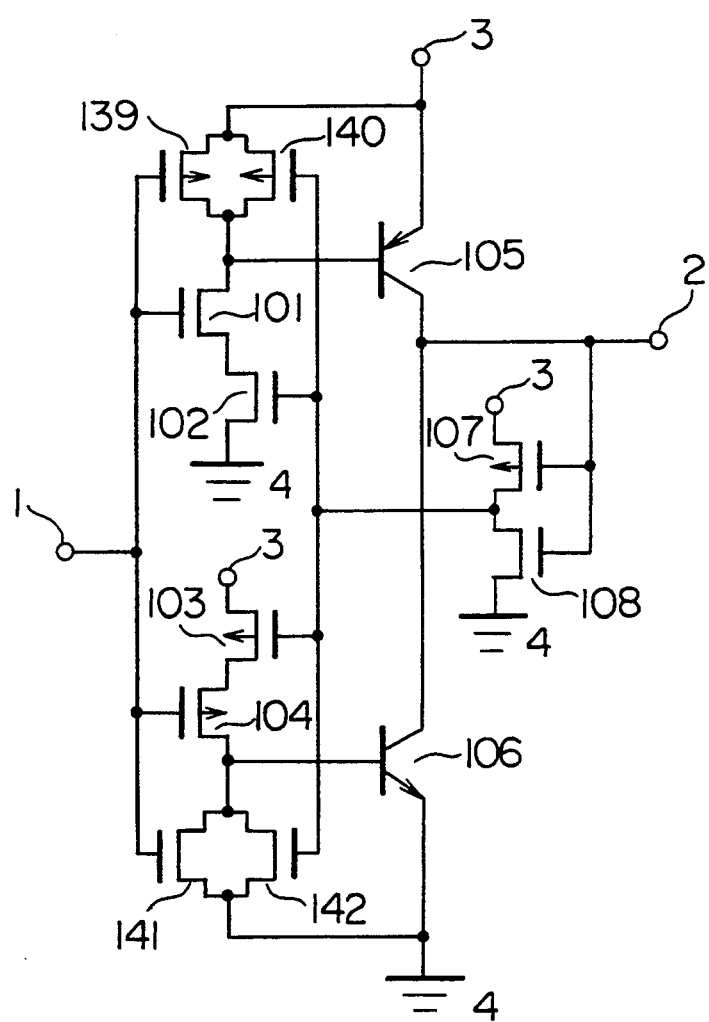
FIG. 7 is a diagram showing a configuration of a gate circuit according to a further embodiment of the present invention.

FIG. 7 is a diagram showing a configuration of a gate circuit according to still another embodiment of the present invention. According to this embodiment, the resistor 109 used in the embodiment of FIG. 1 is replaced by a parallel connection of pMOSs 139 and 140, and the resistor 110 by a parallel connection of nMOSs 141 and 142. The other component parts are the same as those in the embodiment of FIG. 1 and therefore the gate circuit operation will not be described in detail, but the difference in operation between the embodiment of FIG. 1 and that of the present embodiment will be explained below.

Reference is had to a case in which the gate circuit operates for releasing the load capacitive charges. According to the embodiment shown in FIG. 1, the base charge of an NPN transistor is discharged through the resistor 110 at the end of a capacitive load discharge operation. If a passive element is used as a means for discharging the base charges, however, part of the driving current of pMOS 104 would undesirably leak to the GND through a passive element 110 without flowing to the base of the NPN transistor 106 at the time of load capacitive discharge operation. If the base discharge section is raised to high impedance during the load capacitive discharge operation, all the driving current of pMOS 104 is effectively usable as a base current of the NPN transistor 106, and therefore the NPN transistor 106 is expected to increase in the driving force. The resistor 110 in FIG. 1 is replaced by two nMOSs 141 and 142 in parallel. The gate of nMOS 141 is connected to the input terminal 1, and the gate of nMOS 142 is supplied with a reverse signal of output. When the input signal is at low and high level, the reverse signal of output assumes a high and low level respectively, and therefore only one of nMOSs 141 and 142 is turned on in static terms without fail. In other words, the base discharge operation section is always in low impedance state in static terms.

The instant the input signal changes from high to low level, nMOS 104 begins to drive the NPN transistor, thereby starting the load capacitive discharge operation. At this moment, nMOS 141 changes from on to off state. The output reverse signal that has thus been at low below before the shift of the input signal is switched to high level with a delay of about the switching time. As a result, the output reverse signal remains at low level during the load capacitive discharge operation, with the nMOS 142 kept turned off. The base discharge operation section is thus kept at high impedance during the load capacitive discharge, so that all the driving current of pMOS 104 flows into the base of the NPN transistor 106 thereby to improve the speed of the load capacitive discharge operation.

The embodiment of FIG. 7 was explained above with reference to the load capacitive discharge operation. Both pMOSs 139 and 140 operate in a similar way in the load capacitive discharge operation. By the way, in configuring a multi-input logic gate circuit equivalent to the embodiment of FIG. 5 in the circuit according to the present embodiment, nMOSs 101, 141 are replaced by an nMOS logic section, and pMOSs 104, 139 by a pMOS logic section.

Figure 8:
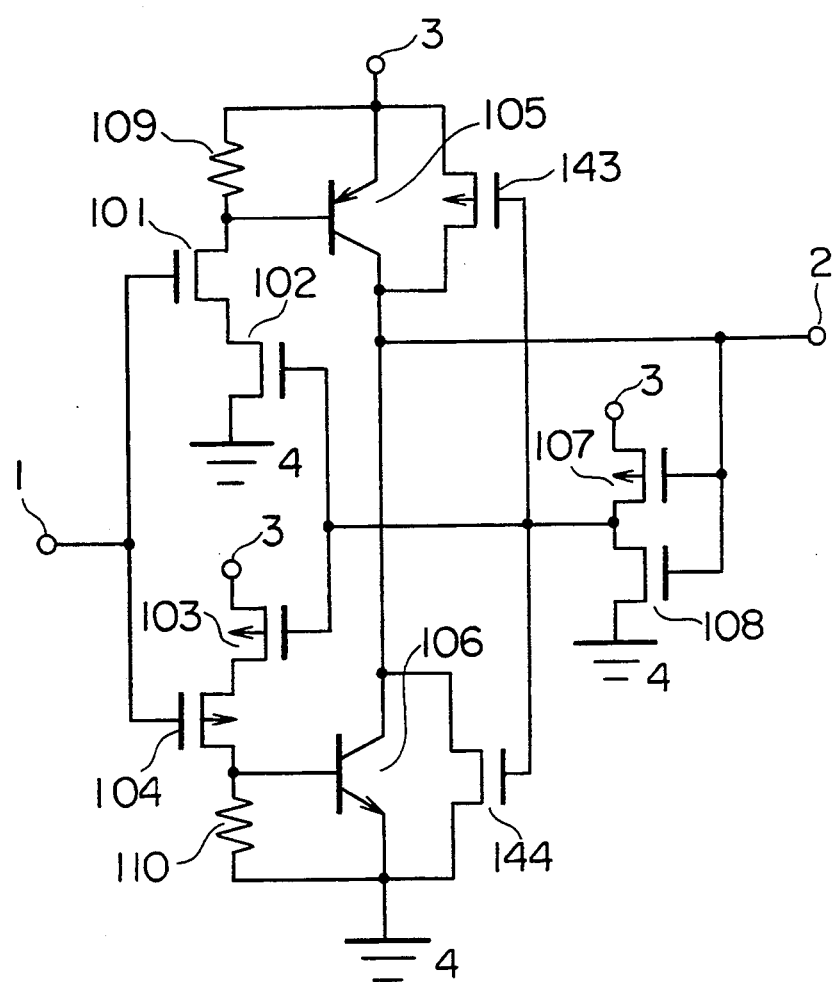
FIG. 8 is a diagram showing a configuration of a gate circuit according to still another embodiment of the present invention.

FIG. 8 is a diagram showing a configuration of a gate circuit according to another embodiment of the present invention. According to this embodiment, pMOS 143 and nMOS 144 are added to the gate circuit shown in FIG. 1. The source-drain circuit of pMOS 143 is connected between a supply potential level 3 and an output node 2, and is responsive to an output signal through a CMOS inverter circuit formed of pMOS 107 and pMOS 108. The source-drain circuit of nMOS 144 is inserted between a grounding potential level 4 and the output node 4, and is responsive to an output signal through a CMOS inverter formed of pMOSs 107 and 108. The functions of other than pMOS 143 and nMOS 144 are identical to the corresponding ones in the embodiment of FIG. 1, and therefore the gate circuit operation will not be explained in detail, except for the difference between the present embodiment and the embodiment shown in FIG. 1.

First, the PNP transistor 105 and NPN transistor 106 are both in off state on the switching operation in both embodiments of FIGS. 1 and 8. In a load capacitive discharge operation, for example, the NPN transistor 106 turns on during the switching operation. After the output reaches low level, however, the NPN transistor 106 is turned off as base charges are released from the resistor 110. On the other hand, the PNP transistor 105 is kept off both before and after the load capacitive discharge operation.

As explained above, in the embodiment of FIG. 1, once the two bipolar transistors turn off, the output terminal 2 "floats" and is easily affected by an external noise of the gate circuit. This floating is avoided by adding pMOS 143 and nMOS 144 in the embodiment of FIG. 8. After the load capacitive discharge operation, for instance, the gate responds to an output reversal signal of low level and the nMOS 144 is turned on, thereby fixing the output to the GND level 4. In similar fashion, the gate responds to a low-level output reversal signal after the load capacitive charge operation, so that pMOS 143 turns on, thereby fixing the output of the supply voltage. By the way, according to the present embodiment, the resistors 109, 110 may be replaced with equal effect by pMOSs 139, 140 and nMOSs 141, 142 as shown in the embodiment of FIG. 7. Also, pMOS 143 and nMOS 144 are preferably in the effective channel region to reduce the input capacitance.

Figure 9:
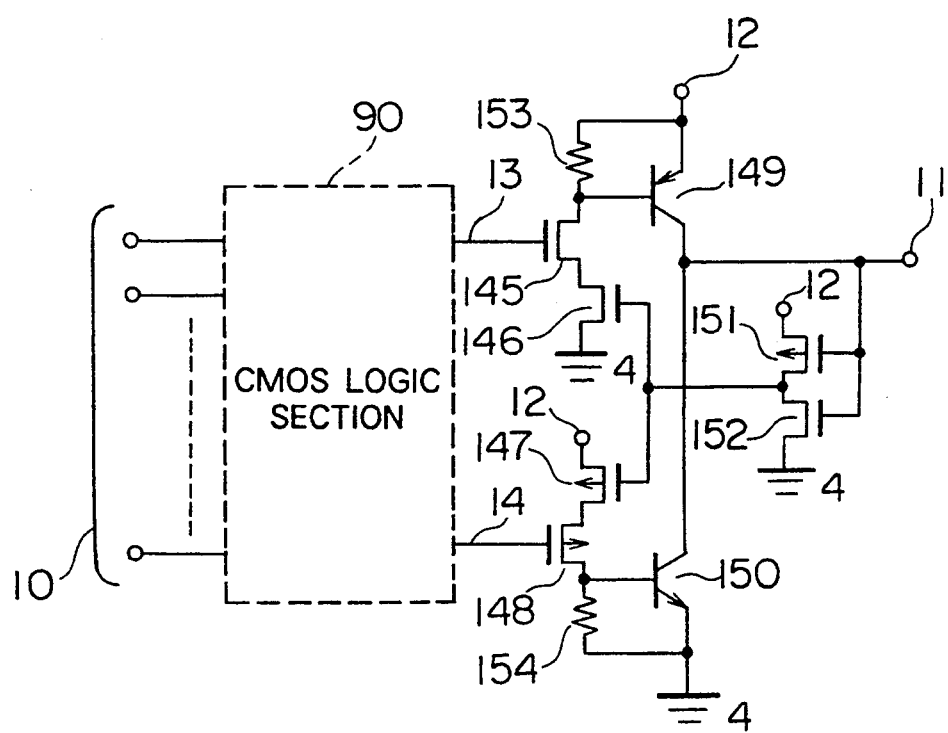
FIG. 9 is a diagram showing a configuration of a further embodiment of the present invention.

A configuration of a gate circuit according to still another embodiment of the present invention is shown in FIG. 9. Unlike the embodiment of FIG. 5 having a circuit configuration of logic gates with a non-reversal logic functions such as AND or OR, the embodiment shown in FIG. 9 makes up a general circuit configuration of a logic gate circuit having reversal-type logic functions such as NOT, NAND and NOR. Numeral 10 designates a single or a plurality of input terminals, numeral 11 an output terminal, and numeral 12 a supply voltage terminal. Also, the nMOSs 145, 146, 152, pMOSs 147, 148, 151, PNP transistor 149, NPN transistor 150 and the resistors 153, 154 correspond to the nMOSs 101, 102, 108, pMOSs 103, 104, 107, PNP transistor 105, NPN transistor 106 and the resistors 109, 110 in FIG. 1, respectively.

According to the present embodiment, the logic value produced from a CMOS logic section configured of a CMOS is applied to terminals 13 and 14, which constitute a CMOS logic section 90 in such a manner as to always produce the same logic value. The CMOS logic section 90 is capable of logic operation of reversal type. Also, the logic value applied to the terminals 13 and 14 is coincidental with the logic value of the output terminal 11. As a result, the gate circuit assumes a logic operation of reversal type as a whole.

Figure 10:
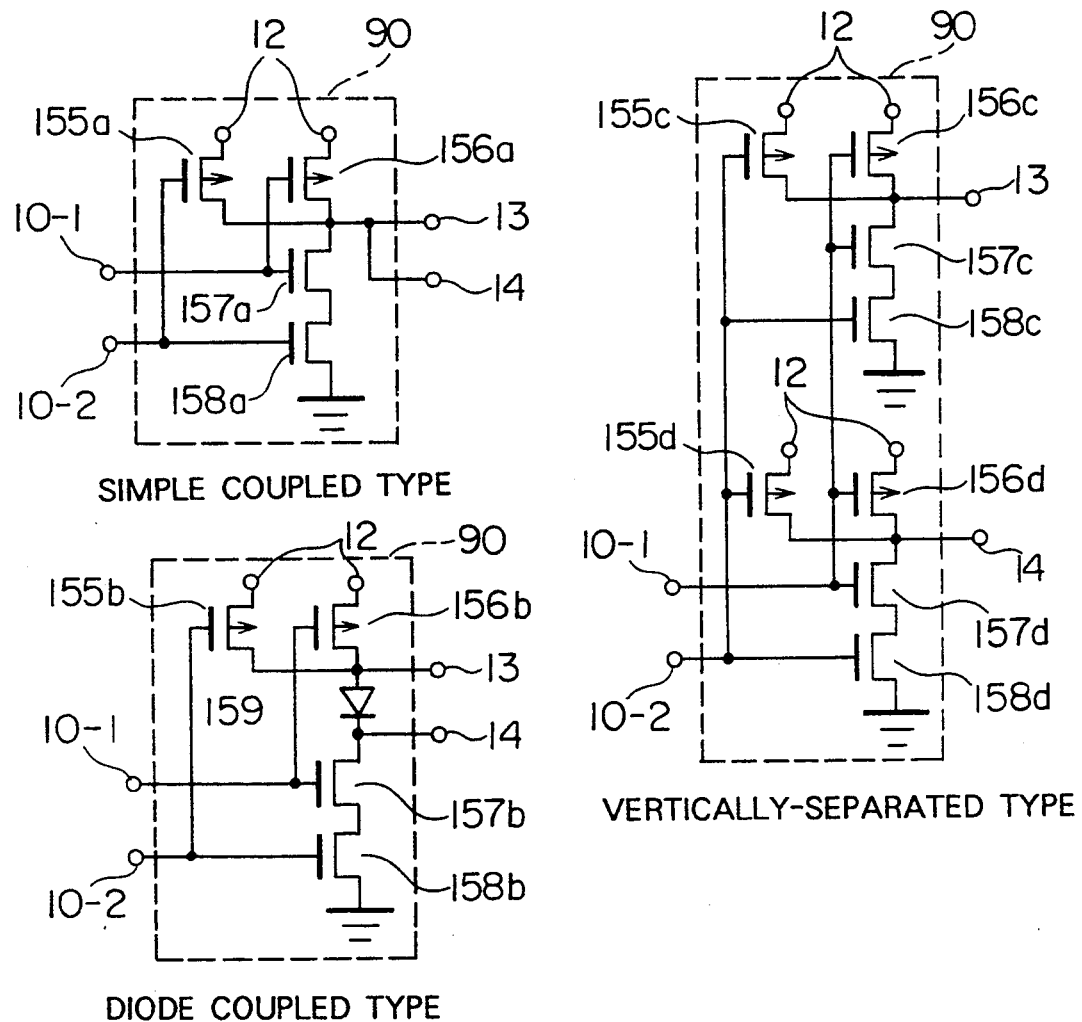
FIG. 10 is a diagram showing a configuration of a gate circuit according to another embodiment of the present invention.

FIG. 10 shows an example of configuration of the CMOS logic section 90 for a two-input NAND. Numerals 10-1 and 10-2 designate input terminals, numerals 155a, 156a, 155b, 156b, 155c, 156c, 155d, 156d pMOSs, numerals 157a, 158a, 157b, 158b, 157c, 158c, 157d, 158d nMOSs, numeral 159 a PN-junction diode or a Schottky barrier diode or a MOS transistor connected to a diode.

Figure 11:
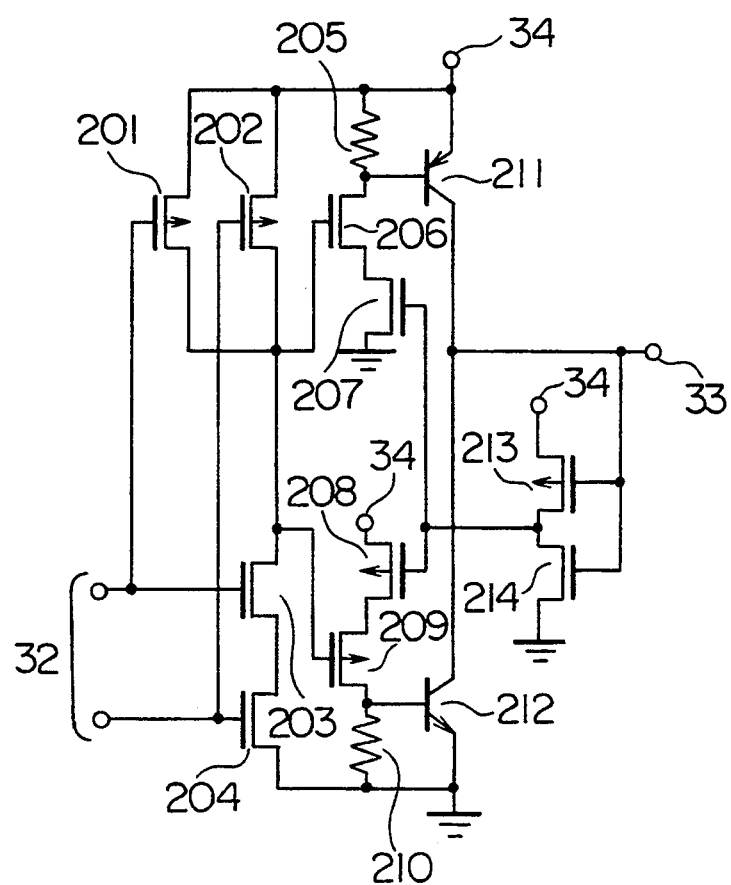
FIG. 11 is a diagram showing a configuration of a further embodiment of the present invention.

The simple-coupled type is the simplest example of configuration with the terminals 13 and 14 connected jointly to the CMOS output. In the diode-connected type, on the other hand, the voltage amplitude of the terminals 13 and 14 is reduced by the magnitude of the forward voltage of the diode 159, and therefore the delay time due to the parasitic capacitance is reduced correspondingly. In the vertically-separated type, the upper CMOSs 155c to 158c are increased in the gate width of pMOS to strengthen the pull-up, while the lower CMOSs 155c to 158c are increased to strengthen the pull-down thereby to improve the speed of the switching operation. FIG. 11 shows an example of a combination of simple-coupled types of devices.

Figure 12:
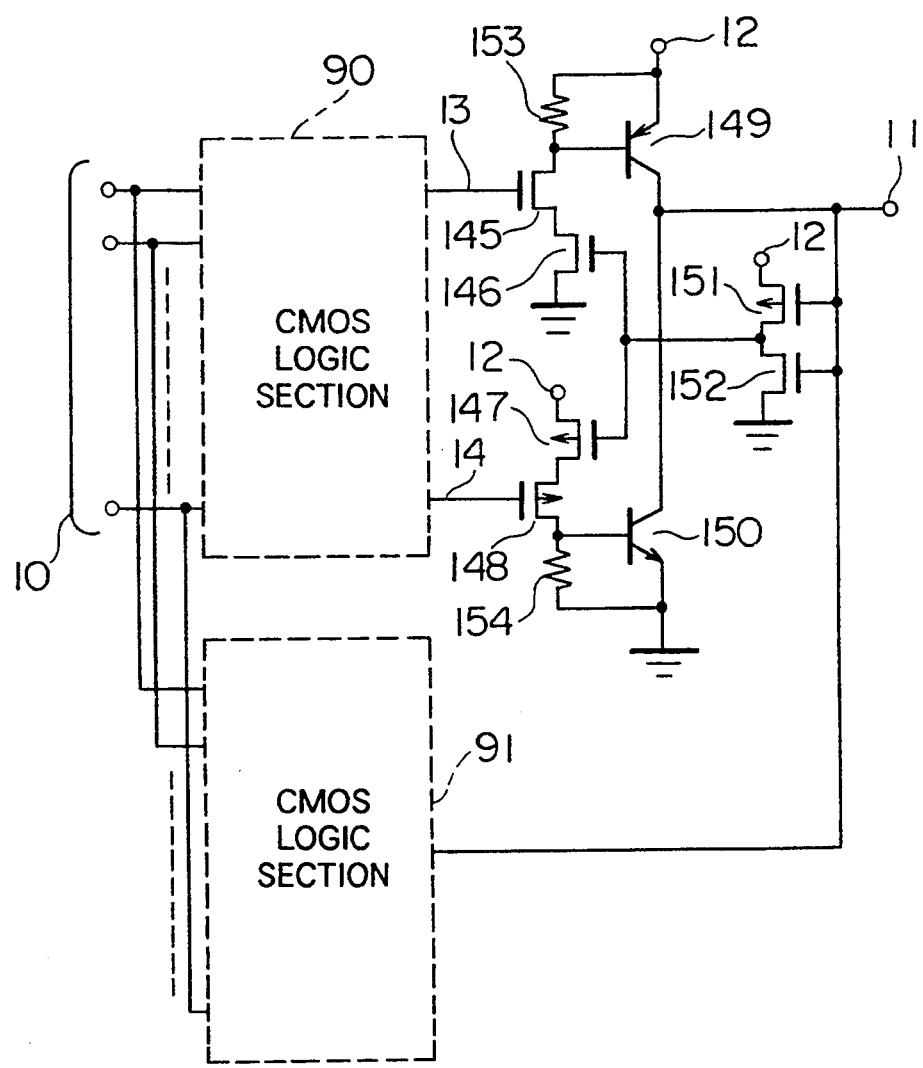
FIG. 12 is a diagram showing a configuration of still another embodiment of the present invention.

FIG. 12 is a diagram showing a configuration of a gate circuit according to another embodiment of the present invention. According to the present embodiment, a logic gate circuit 91 having a CMOS of the same logic configuration as the CMOS logic section 90 is connected in parallel to the reversal-type logic gate circuit of FIG. 9. Although the floating condition is avoided as described above with an output fed back according to the embodiment shown in FIG. 8, the present embodiment is such that a MOS logic gate circuit 91 is connected in parallel to the reversal-type logic gate circuit shown in FIG. 9 to avoid the floating of the output 11 thereby to reduce noises. The sole object of the MOS logic gate circuit 91 connected in parallel is to avoid the floating, and therefore may be small in gate width and occupy only a slightly increased area. Also, in spite of the fact that the output feedback affects the circuit operation in the embodiments shown in FIGS. 1, 5 to 9, the present embodiment includes a path capable of determining an output only in accordance with an input.

Figure 13:
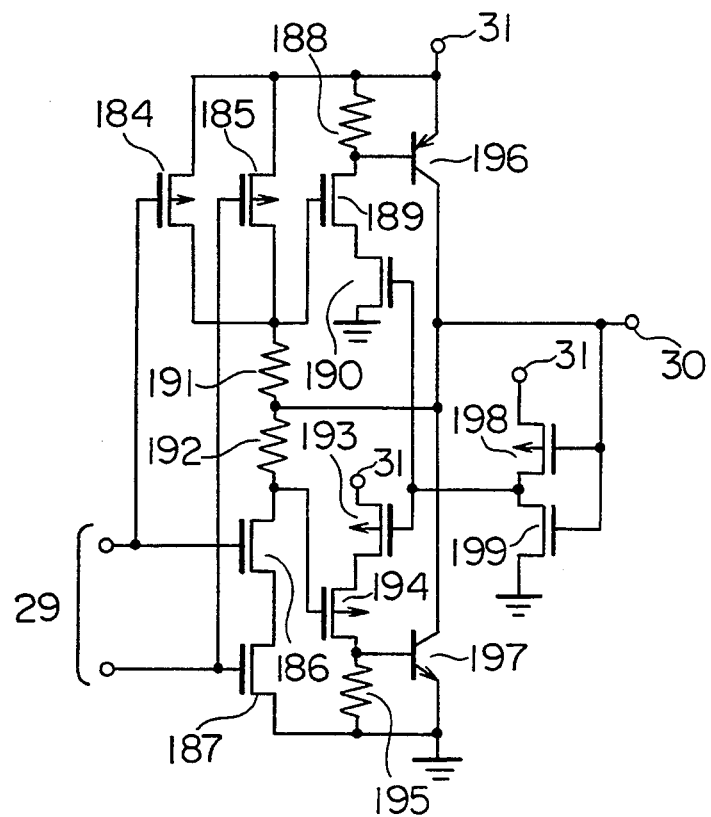
FIG. 13 is a diagram showing a configuration of a further embodiment of the present invention.

FIG. 13 is a diagram showing a configuration of a gate circuit according to still another embodiment of the present invention. Unlike in the embodiment of FIG. 12 in which a CMOS logic gate circuit 91 is connected in parallel to a logic gate circuit of reversal type, according to the present embodiment, the CMOS logic section 90and the CMOS logic gate circuit 91 are unified, so that resistors 191, 192 are inserted between the pMOSs 184, 185 and nMOSs 186, 187, with an output connected between the two resistors. According to this embodiment, as in the embodiment shown in FIG. 13, the floating of the output 30 is avoided on the one hand and a path is provided capable of determining an output solely from the input on the other hand.

Figure 14:
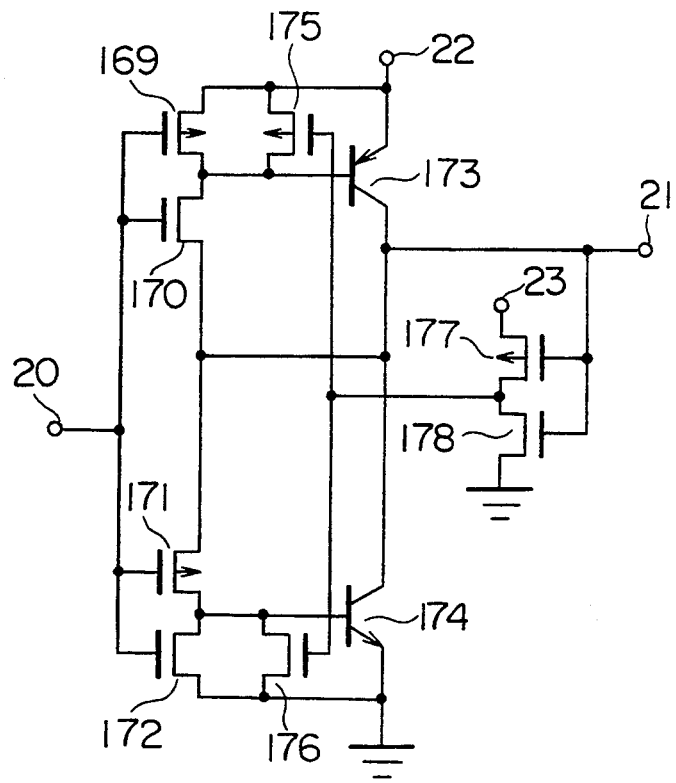
FIG. 14 is a diagram showing a configuration of a still further embodiment of the present invention.

FIG. 14 is a diagram showing a configuration of a gate circuit according to a further embodiment of the present invention. According to this embodiment, the resistors 109 and 110 used in the embodiment of FIG. 1 are replaced by a pMOS 169 and an nMOS 172 with the gates thereof connected to the input, while the sources of nMOS 170 and pMOS 171 are connected to the output to eliminate feedback. As compared with the embodiment of FIG. 1 in which the path of the base current is cut off by feedback, the embodiment under consideration utilizes the fact that the voltage between the gate and source of the nMOS 170 and pMOS 171 is reduced below the MOS threshold voltage by the change of the output voltage, naturally leading to a non-conductive state. These components may be replaced with resistors as in the embodiment shown in FIG. 1. In the present embodiment, however, the connection of the source to the output causes a sudden voltage drop between the gate and source of the nMOS 170 and pMOS 171 resulting in an increased channel resistance. Unless a considerable resistance value is maintained, therefore, the MOS channel resistance becomes larger than the resistance value of the resistors before full swing of output, with the result that a voltage of more than Vbe fails to be applied to the base of the bipolar transistor and the base current ceases to flow. The resultant failure of full amplitude operation makes impossible the operation under a low supply voltage. If the resistance value is increased, the charges accumulated in the base cannot be pulled out after full amplitude operation of the output, and the bipolar transistor is saturated, thereby adversely affecting the rapidity of operation. According to the present embodiment, therefore, a MOS is recommended to control the flow of a base current and pull-out of base charges, i.e., conductive and non-conductive stages by a gate voltage. A signal fed back from the output is applied to MOSFETs 175, 176 inserted between the base and emitter as in the embodiment of FIG. 7 as a means for pulling out the base charges after the rise (or fall) of the output.

The present embodiment, which lacks resistors unlike the embodiment of FIG. 1, has the advantage of a smaller area of occupancy. In spite of this, a change in output voltage suddenly reduces the gate-source voltage of nMOS 170 and pMOS 171 leading to a higher channel resistance and adversely affecting the operating speed to some degree. This embodiment, like the embodiment of FIG. 5, may be configured of multi-input logic.

Figure 15:
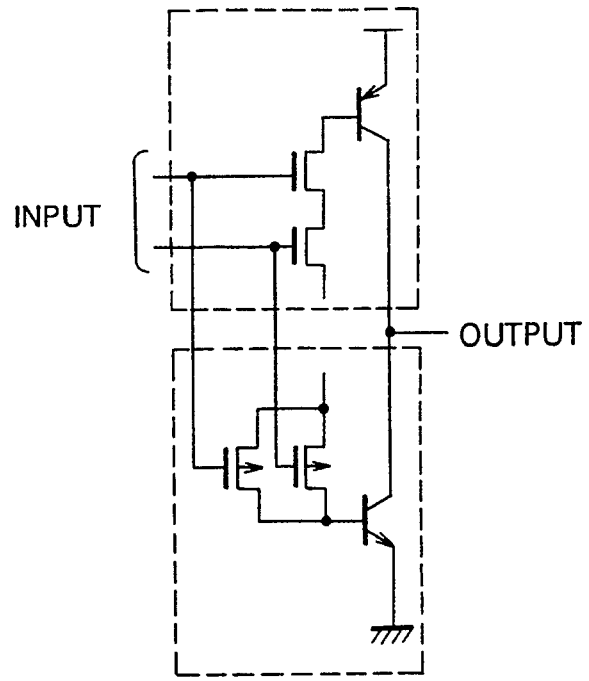
FIG. 15 is a diagram showing a gate circuit providing a representative example of circuit configuration according to the present invention.
Figure 16:
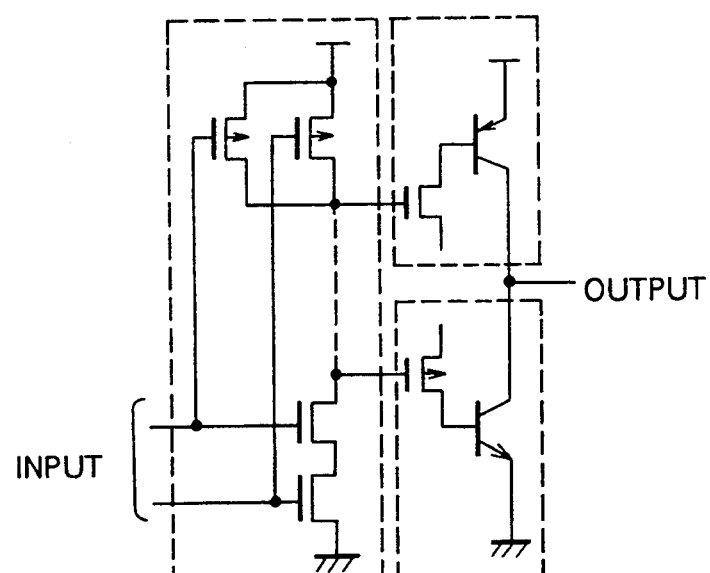
FIG. 16 is a diagram showing a configuration of another gate circuit providing a representative example of circuit configuration according to the present invention.

Representative examples of the circuit configuration described above are summarized in FIGS. 15 to 17. The embodiments of the present invention are roughly divided into reversal and non-reversal types. The former includes a logic section, a pull-up section and a pull-down section as shown in FIG. 16, and the latter is made up of a pull-up section and a pull-down section as shown in FIG. 15. Circuit variations of these types are shown in FIG. 17, and may be combined to form various circuit configurations. Although FIG. 17 shows circuits of a logic section and a pull-down section alone, the NPN transistor of the pull-down section may be replaced by a PNP transistor, nMOS by pMOS, pMOS by nMOS and GND by a power supply for application as a pull-up section. The reversal type of circuit configuration has a logic section to process logics, while the non-reversal operation is performed by connecting MOSs of the pull-up and pull-down sections in series or parallel as described above.

Figure 18:
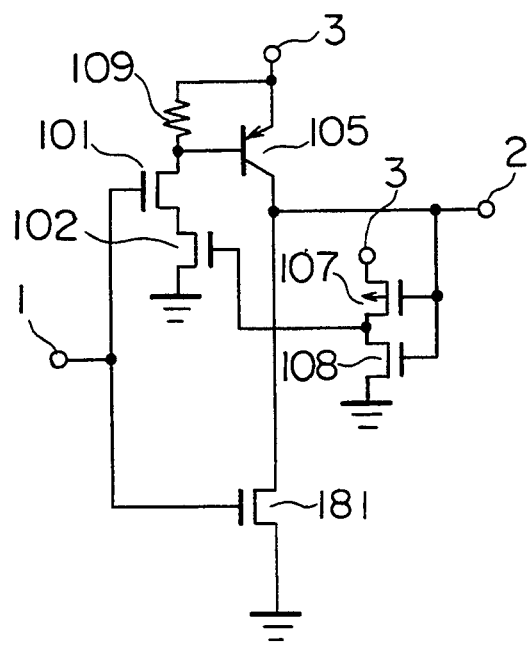
FIG. 18 is a diagram showing a configuration of a gate circuit according to still another embodiment of the present invention.
Figure 19:
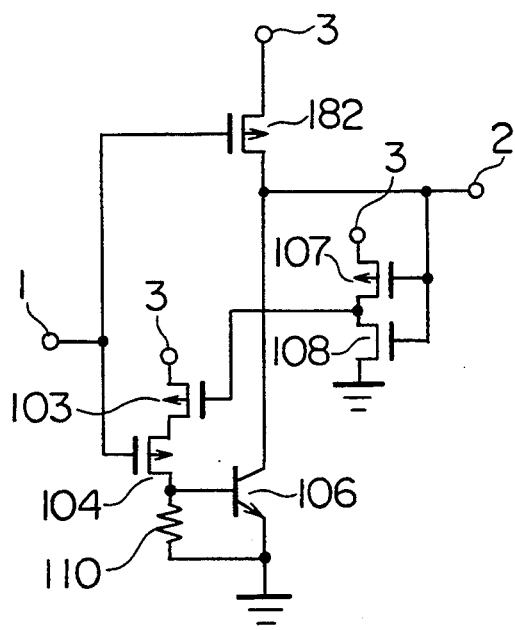
FIG. 19 is a diagram showing a configuration of a gate circuit according to another embodiment of the present invention.

The pull-up and pull-down sections of reversal type may be combined with a conventional BiCMOS circuit or a MOS. An embodiment of an inverter gate circuit combined with a MOS is shown in FIGS. 18 and 19. FIG. 18 shows an embodiment with a pull-up section configured as a gate circuit according to the present embodiment, and a pull-down section as a MOS gate circuit. FIG. 19, on the other hand, shows an embodiment with a pull-up section configured as a MOS gate circuit and a pull-down section as a gate circuit according to the present invention.

Figure 42:
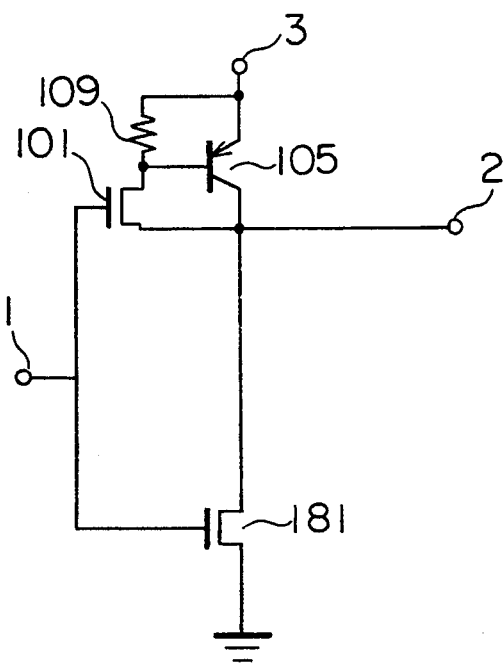
FIG. 42 is a diagram showing a configuration of a gate circuit according to another embodiment of the present invention.
Figure 43:
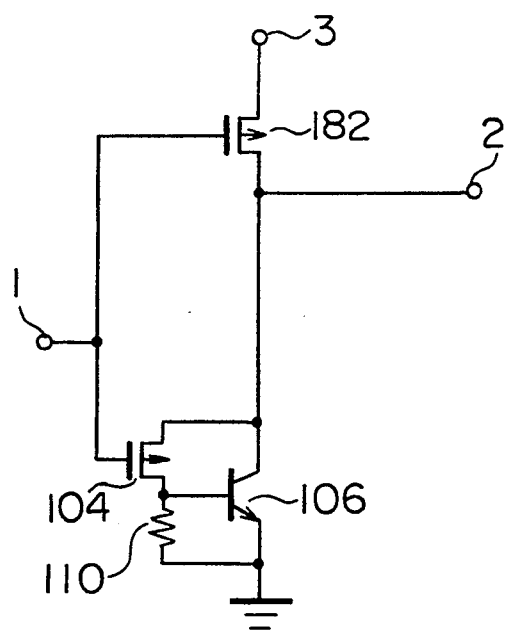
FIG. 43 is a diagram showing a configuration of a gate circuit according to still another embodiment of the present invention.

The circuit shown in FIG. 42, in which the field effect transistor 102 and the inverters 107, 108 shown in FIG. 18 are not included, realizes the present invention with a simplified configuration.

Figure 20:
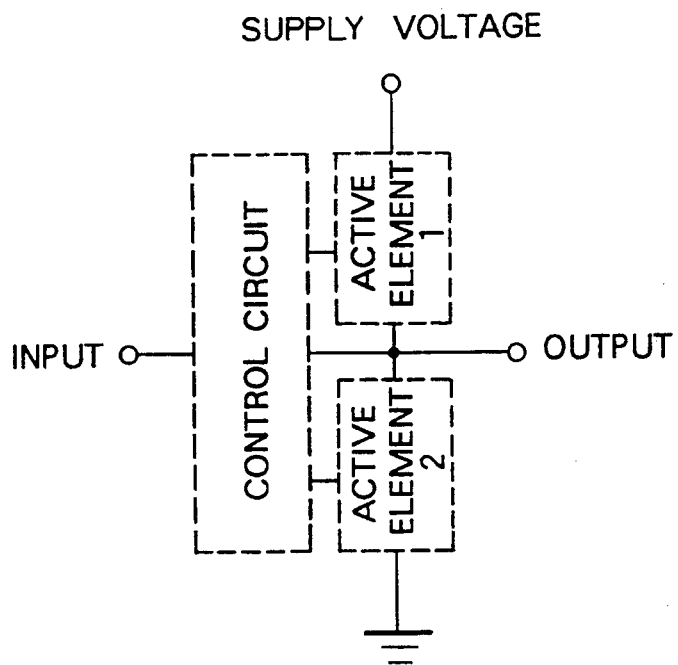
FIG. 20 is a diagram showing a general configuration of a gate circuit according to the present invention.
Figure 21:
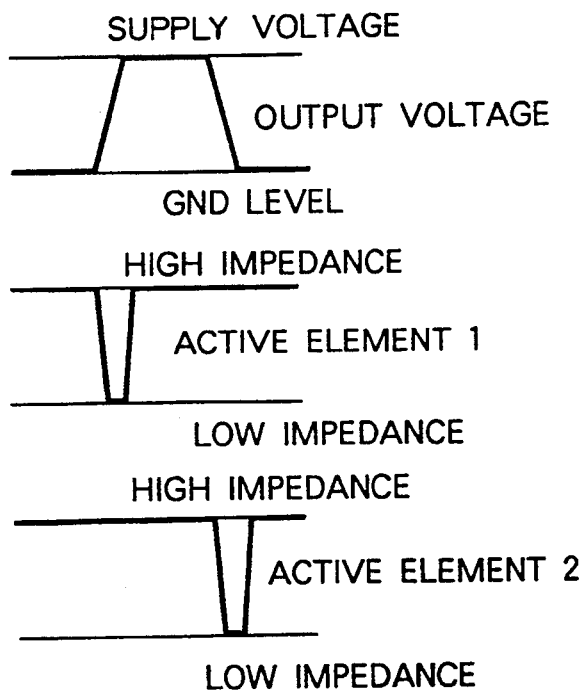
FIG. 21 is a diagram showing general operation of a gate circuit according to the present invention.

The concept of the gate circuit described above is illustrated in blocks as shown in FIG. 20. This circuit includes a control circuit and active elements. The active elements, which are bipolar transistors in the above-mentioned embodiments, may alternatively be a MOSFET, MESFET, SIT or the like devices. According to the present invention, as shown in FIG. 21, only one of the two active elements changes to low-impedance state only during a substantially transient period when the output is switched. The other active element remains at high impedance, and therefore no through current flows from a power supply to the ground. As a result, a rapid operation is realized with a low power consumption.

Figure 22:
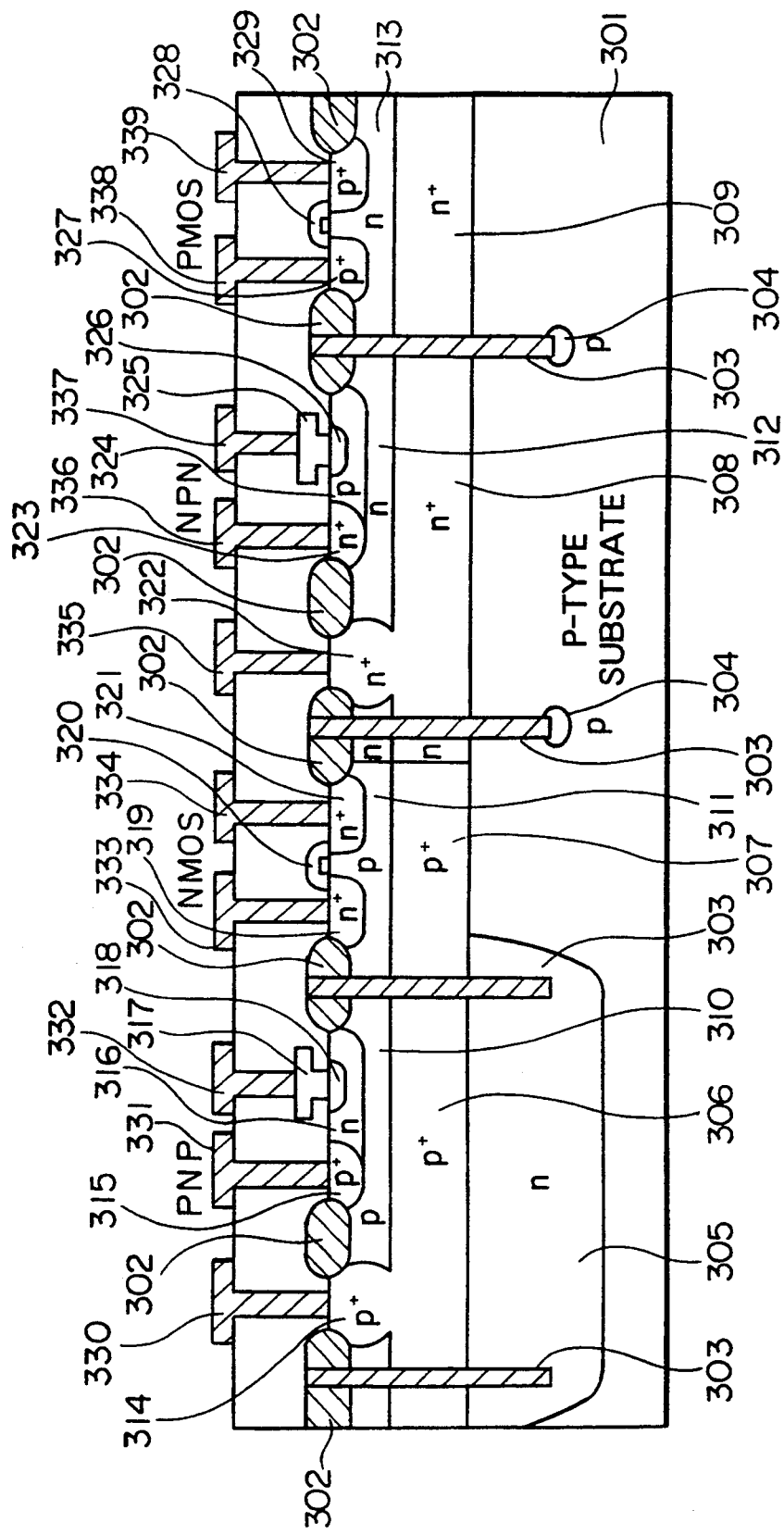
FIG. 22 is a sectional view of a device structure according to an embodiment of the present invention.

FIG. 22 is a diagram showing a BiCMOS device structure according to an embodiment of the present invention.

In this embodiment, an nMOS, a pMOS, a NPN transistor and a PNP transistor are formed on a P-type substrate. The P well of the nMOS and the substrate are isolated from each other by a high-concentration P-type buried layer formed by the same process as the high-concentration collector layer of the PNP transistor. In similar fashion, the N well of the pMOS is reinforced by a high-concentration N-type buried layer formed by the same process as the high-concentration collector layer of the NPN transistor. The bipolar transistor is subjected to what is called the trench isolation that a trench is filled up with an insulating material.

As described above, in a gate circuit according to the present invention with the collector of a bipolar transistor providing an output, it is necessary to insulate and separate the collector from the substrate and other wells. The conventional method widely used for this purpose was the isolation by a field oxide film and a PN junction due to the simple process thereof. The isolation by PN junction, however, has a high-concentration layer of the collector in contact with a high-concentration layer for insulative separation resulting in a large parasitic capacitance of the collector. In a gate circuit according to the present invention, an increased parasitic capacitance of the collector leads to an increased load capacitance attached to an output terminal, which in turn increases the gate delay time. According to the present embodiment, a trench isolation is employed with a single depth of a trench 303 in order to permit the coexistence of high-performance NPN and PNP transistors without adding many processes. The trench 303 is required to have at least such a depth that the collectors 306 and 308 of the NPN and PNP transistors are both insulated from the other regions. In other words, the trench 303 must be deeper than the collectors 306, 308. In addition, an N-type buried layer 305 is formed in order to isolate the collector 306 of the PNP transistor from the substrate 301.

Also, if a complete isolation is to be assured, it is desirable to apply a predetermined voltage such as a supply voltage to the N-type buried layer from another region not shown. For this purpose, it is necessary to provide an N-type region which reaches from the surface to the N-type buried layer 305. This N-type region is required to be formed outside of the region of the PNP transistor surrounded by the trench 303. According to the present embodiment, therefore, the N-type buried layer 305 is formed deeper than the trench 303 to enable a potential to be supplied to the N-type buried layer 305. As a result, it is impossible to isolate the collector layer 306 from the substrate 301 unless the N-type buried layer is extended outside of the region of the PNP transistor. When the trench 303 is made deeper than the N-type buried layer 305, a shallow trench would be required for isolating the collector 306 from the N-type region reaching from the surface to the N-type buried layer 305. Nevertheless, only one type of trench suffices according to the present embodiment. As seen from above, the present embodiment easily realizes a high-performance BiCMOS device and a gate circuit by a simplified trench isolation process.

Also, in spite of the fact that the N-type buried layer 305 is formed only under the PNP transistor region according to the present embodiment, another N-type buried layer may be formed under the nMOS region in order to prevent an operation error due to an external noise arriving through the substrate. Further, the trench isolation need not be provided at other than the boundary between the pMOS and nMOS regions and the bipolar transistor section, and isolation with a field oxide film with smaller isolation intervals serves the purpose within the nMOS or pMOS region.

Furthermore, the P wells 310 and 311 may have the same impurities concentration profile. Nevertheless, the impurities concentration of the P well 310 is determined by the breakdown voltage or fT of the PNP transistor and that of the P well 311 by the threshold voltage or the short channel characteristics of the nMOS. It is thus recommended that different impurities concentrations be employed for the two P wells and optimized to obtain better characteristics. This is also the case with the N wells 312 and 313.

Figure 23:
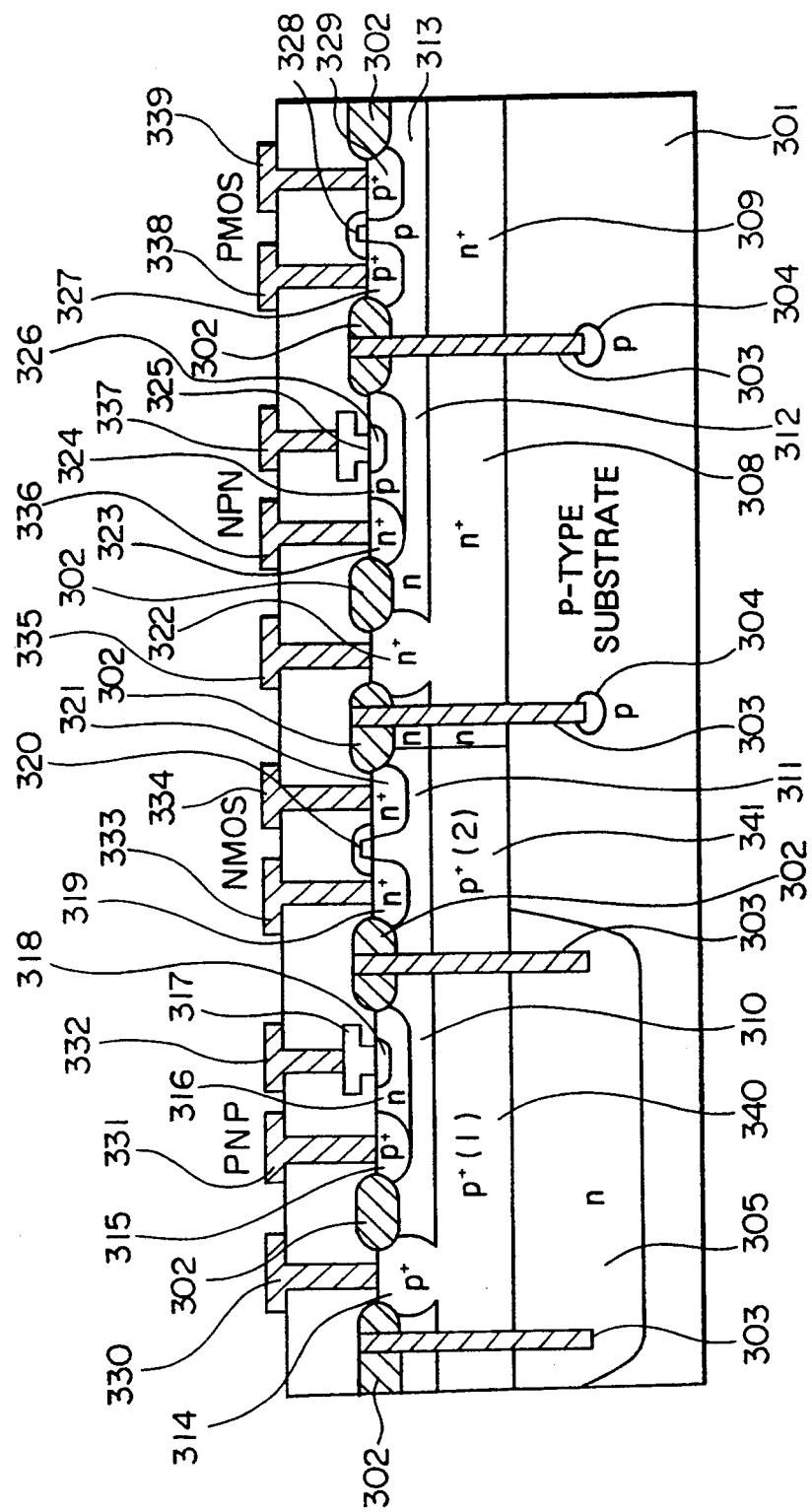
FIG. 23 is a sectional view of a device structure according to another embodiment of the present invention.

Another embodiment of the BiCMOS device structure according to the present invention is shown in FIG. 23.

This embodiment is different from that of FIG. 22 in that in the present embodiment the concentration of the high-concentration collector layer 340 of the PNP transistor is different from that of the P-type high-concentration layer 341 isolating the P-well 311 and the substrate 301 of the nMOS from each other. For reducing the collector resistance, the concentration of the high-concentration collector layer 340 is desirably as high as possible, only to the extent that the surface of the P well 311 and hence the threshold voltage of the nMOS is not affected. In other words, the buried layers have their own different optimum concentration values, which are differentiated according to the present embodiment to produce an optimized high-performance device.

Figure 24:
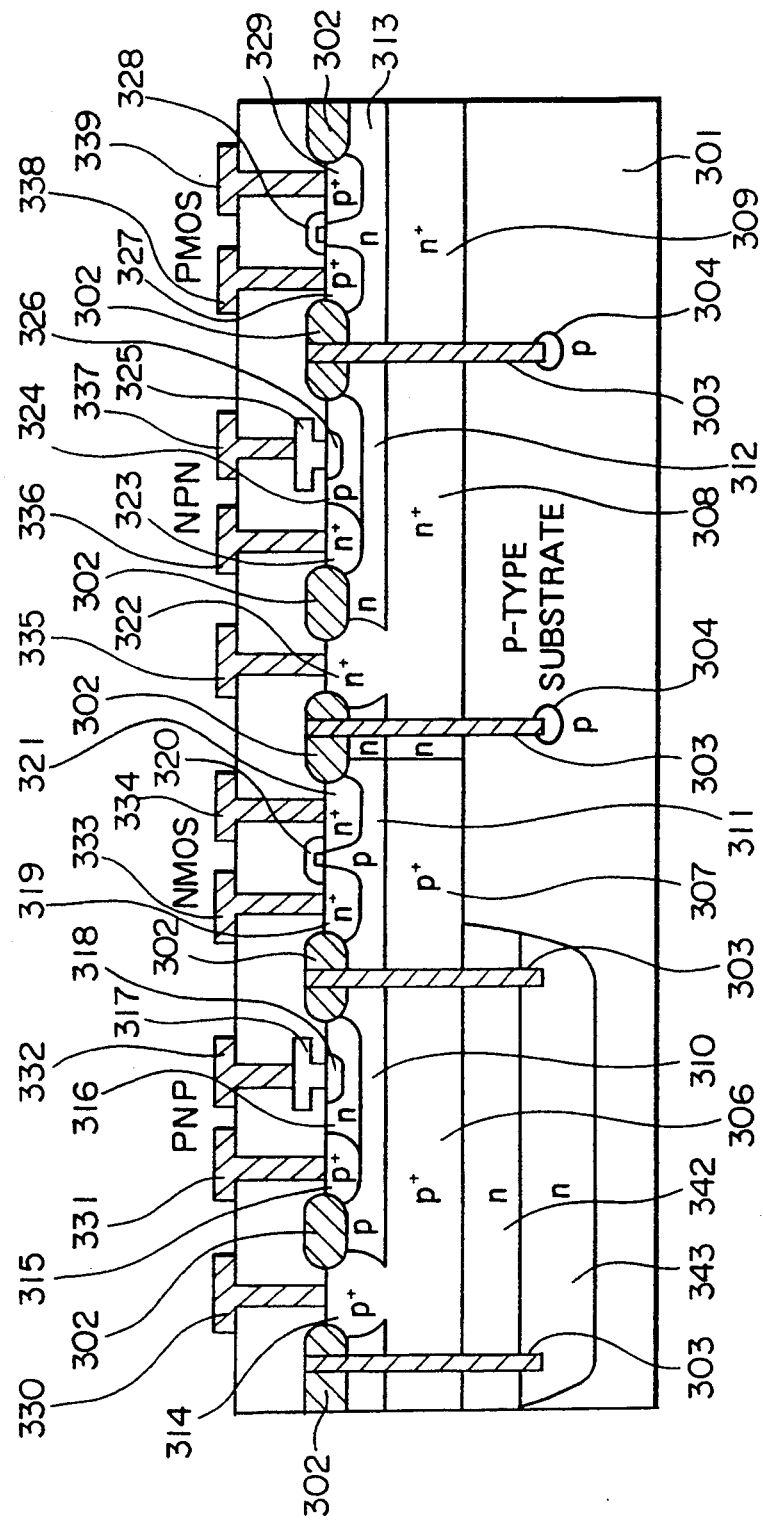
FIG. 24 is a sectional view of a device structure according to still another embodiment of the present invention.

A further embodiment of the BiCMOS device structure according to the present invention is shown in FIG. 24.

Figure 25:
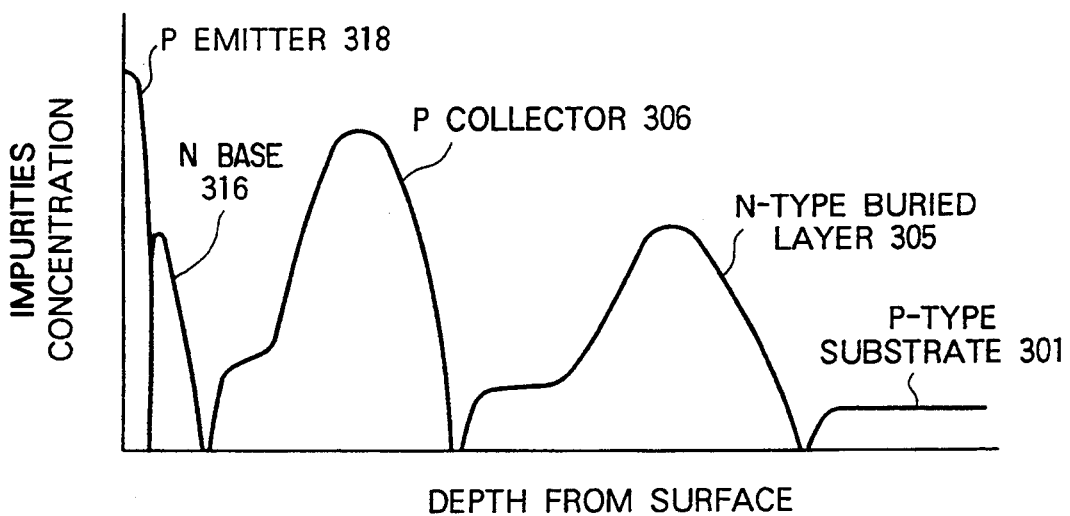
FIG. 25 is a sectional view of a device structure according to a further embodiment of the present invention.

An N-type buried layer 305 should have as low a concentration as possible in order to minimize the collector capacitance. With the decrease in the impurities concentration of the N-type buried layer 305, however, the hFE value of the parasitic PNP transistor made up of the P-type substrate 301, the N-type buried layer 305 and the high-concentration collector layer 306 of the PNP transistor is increased to such an extent as to easily trigger the parasitic PNP transistor. In view of this, according to this embodiment, the concentration of the part 342 in contact with the high-concentration collector layer 306 is reduced to decrease the parasitic capacitance of the collector, while the part 343 in contact with the P-type substrate 301 is increased in concentration, thereby reducing the hFE of the parasitic PNP transistor. FIG. 25 shows an impurities concentration distribution of the PNP transistor region. A highly reliable gate circuit is obtained as a result.

Figure 26:
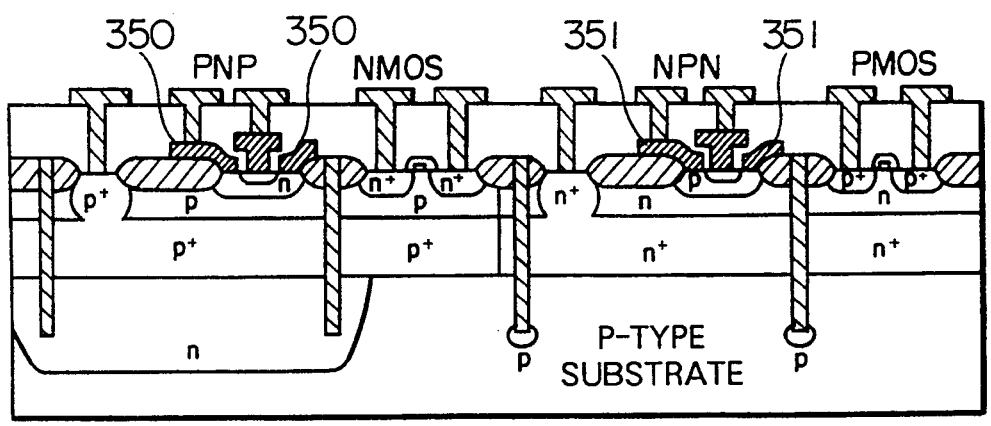
FIG. 26 is a sectional view of a device structure according to a still further embodiment of the present invention.

A still further embodiment of the BiCMOS device structure according to the present invention is shown in FIG. 26.

According to this embodiment, a bipolar transistor with emitter and base thereof formed in self-aligning fashion is used as a PNP transistor and an NPN transistor. This embodiment permits reduction in not only the collector parasitic capacitance but also the base parasitic capacitance, thereby realizing a gate circuit of higher speed.

Figure 27:
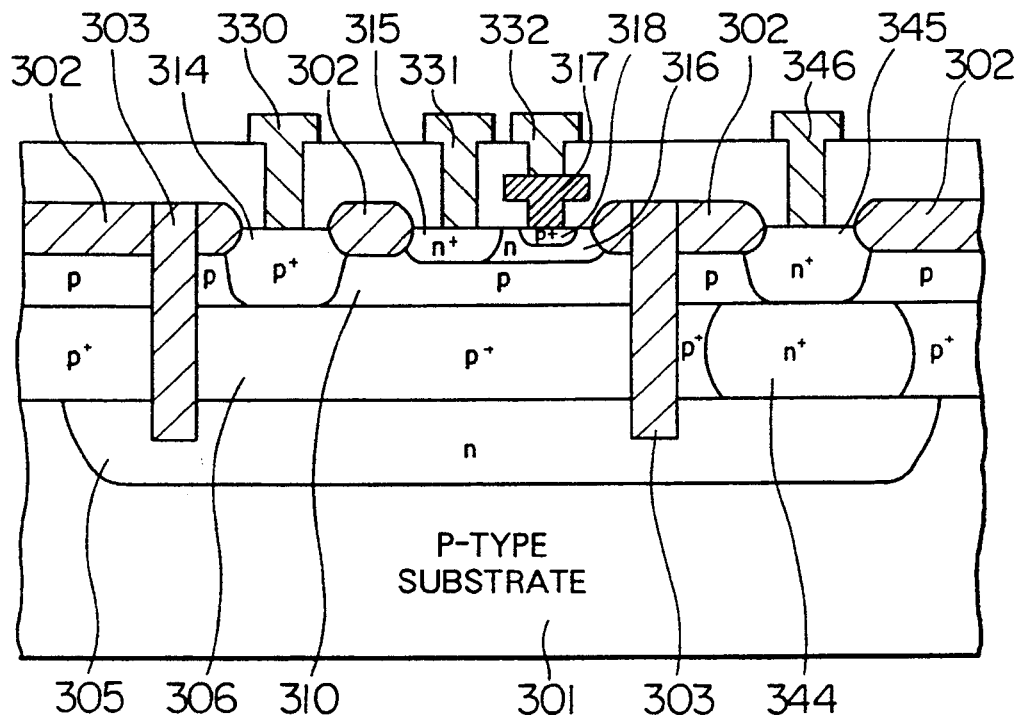
FIG. 27 is a sectional view of a device structure according to another embodiment of the present invention.
Figure 28:
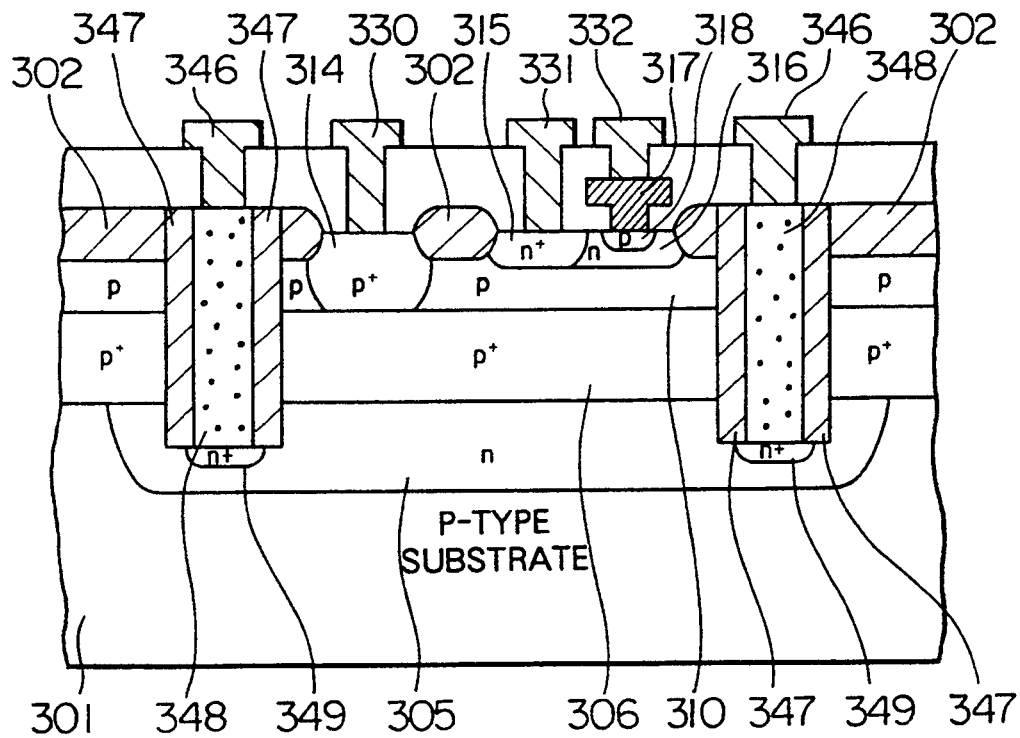
FIG. 28 is a sectional view of a device structure according to still another embodiment of the present invention.

FIGS. 27 and 28 show an example of the method for providing an electric potential to the N-type buried layer mentioned above.

In FIG. 27, an N-type lead region 345 and an N-type high-concentration buried layer 344 are formed outside of a device region isolated by a trench 303. The N-type lead region may be formed in the same process as the high-concentration collector layer of the NPN transistor. The feature of this embodiment lies in that neither the N-type lead region 345 or the N-type high-concentration buried layer 344 is in contact with the trench 303. If the N-type high-concentration layer 344 intrudes far into the trench 303 into contact with the collector layer 306 by misalignment or the like, the collector capacitance would increase undesirably. The trench 303 is therefore formed at a distance according to the present embodiment.

In FIG. 28, a polycrystal silicon 348 doped with N-type impurities at high concentration is buried at the central portion of the trench 347 to provide an electric potential to the N-type buried layer 305. According to the present embodiment, as compared with the embodiment shown in FIG. 27, the area of the region for providing a potential to the N-type buried layer 305 is reduced.

Figure 29:
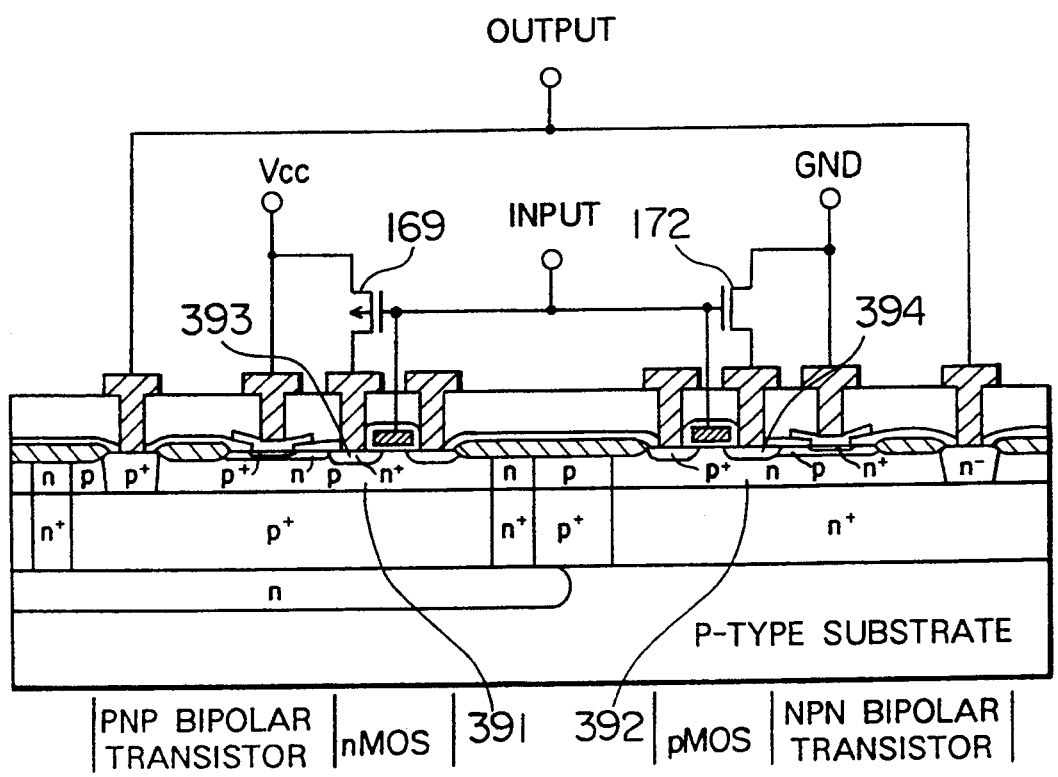
FIG. 29 is a sectional view of a device structure according to another embodiment of the present invention.

FIG. 29 shows an example of device structure for realizing a gate circuit on the basis of the embodiment of FIG. 14. According to the embodiment under consideration, the source of nMOS 170 and the outer base of the PNP transistor 173 shown in FIG. 14 are replaced by a common diffused layer region 393, the well of nMOS 170 and the collector of the PNP transistor 173 by a common semiconductor region 391, the source of pMOS 171 and the outer base of the NPN transistor 174 by a common diffused layer region 394, and the well of pMOS 171 and the collector of the NPN transistor 174 by a common semiconductor region 392. As a result, the MOS current is not decreased by the substrate bias effect, and the capacitance attached to the base can be reduced, thereby leading to a higher speed and lower supply voltage.

FIGS. 30 to 36 show an embodiment of the method for fabricating a BiCMOS device according to the present invention. Fabrication processes according to the present embodiment will be described in detail below with reference to FIGS. 30 to 36.

Figure 30:
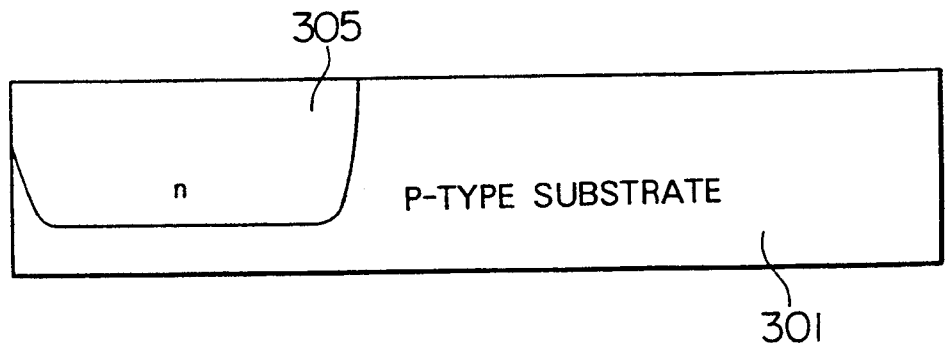
FIG. 30 is a sectional view showing a method of fabricating a device structure according to an embodiment of the present invention.

As shown in FIG. 30, first, an N-type buried layer 305 is formed by ion implantation in the region of a PNP transistor in a P-type substrate 301.

Figure 31:
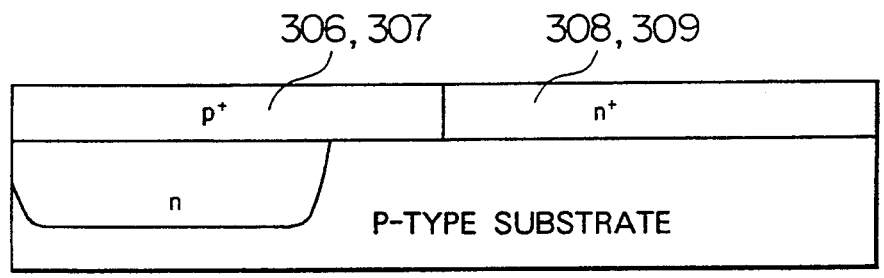
FIG. 31 is a sectional view showing a method of fabricating a device structure according to another embodiment of the present invention.

In the next step, as seen from FIG. 31, high-concentration P-type buried layers 306, 307, and high-concentration N-type buried layers 308, 309 are formed by ion implantation or thermal diffusion.

Figure 32:
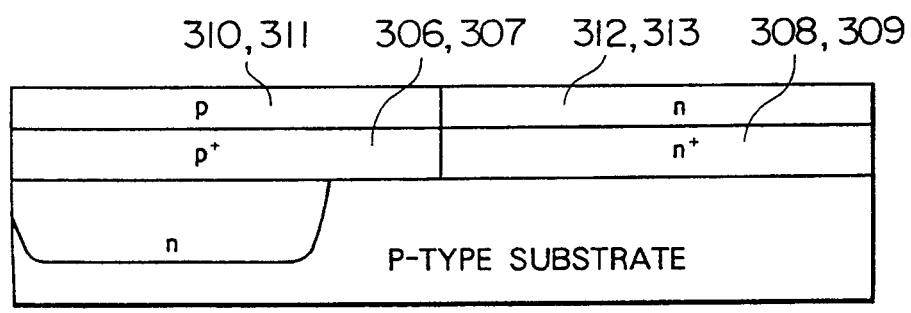
FIG. 32 is a sectional view showing a method of fabricating a device structure according to still another embodiment of the present invention.

In the next step, as shown in FIG. 32, single crystal is deposited on the surface by epitaxial growth, and the p-wells 310, 311 are formed on the p-high concentration buried layer and the n-wells 312, 313 are formed on the n-high concentration buried layer by the ion implantation.

Figure 33:
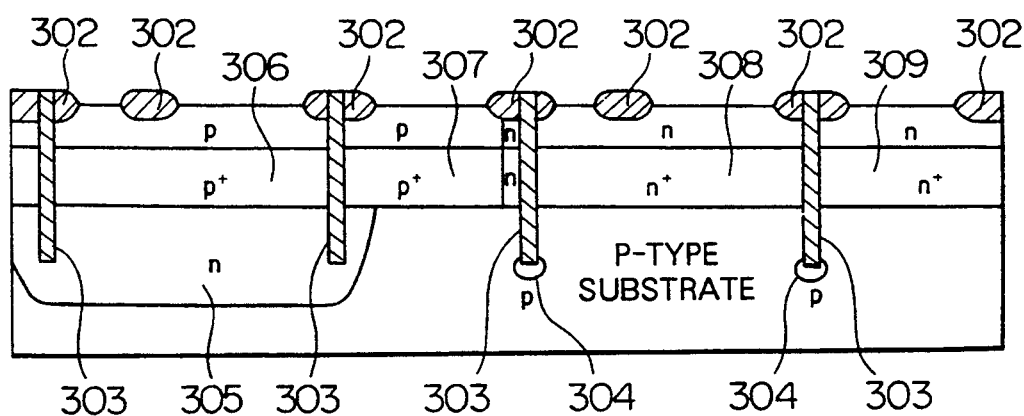
FIG. 33 is a sectional view showing a method of fabricating a device structure according to a further embodiment of the present invention.

In the next step, as seen from FIG. 33, a field oxide film 302 is formed by a well-known method. Then, a trench 303 is formed by etching deeper than the high-concentration P-type buried layers 306, 307 and the high-concentration N-type buried layers 308, 309 but shallower than the N-type buried layer 305. A channel stopper 304 is formed in the bottom of the trench of the NPN transistor region, and an oxide is deposited by CVD on the entire region thereby to fill up the oxide into the trench 303 by CVD.

Figure 34:
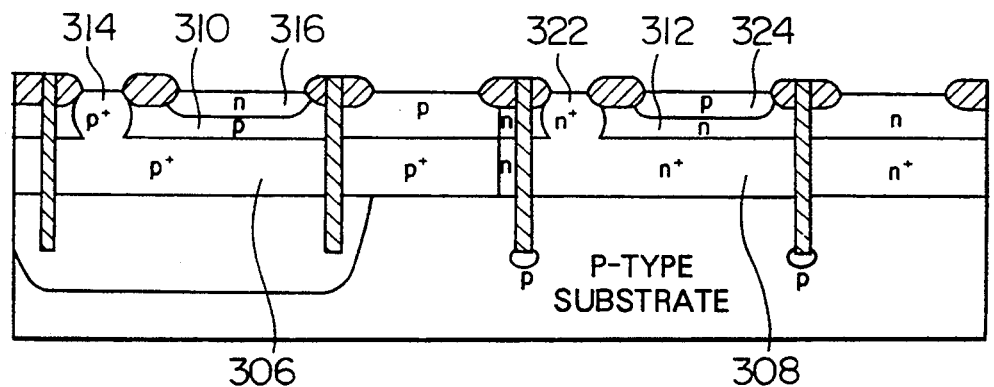
FIG. 34 is a sectional view showing a method of fabricating a device structure according to a still further embodiment of the present invention.

In the next step, as shown in FIG. 34, a collector layer 314 is formed in the PNP transistor region to such a depth as to reach the high-concentration P-type buried layer 306 from the substrate surface, and a collector layer 322 in the NPN transistor region to reach the high-concentration N-type buried layer 308 from the substrate surface, by ion implantation. Similarly, an N-type base region 316 is formed in the exposed surface of the P well of the PNP transistor region, and a P-type base region 324 in the exposed surface of the N well of the NPN transistor region, by ion implantation.

Figure 35:
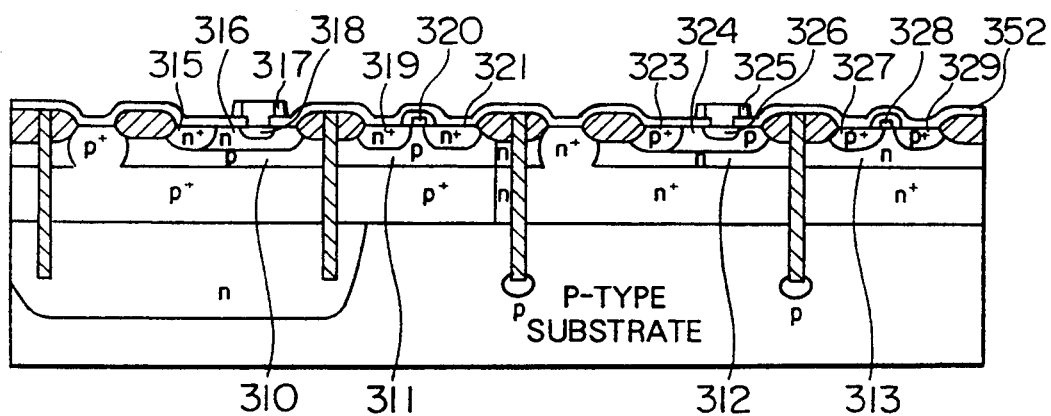
FIG. 35 is a sectional view showing a method of fabricating a device structure according to another embodiment of the present invention.

As the next step, as shown in FIG. 35, the nMOS and pMOS regions are formed with gate electrodes 320, 328 deposited with a silicide layer of a metal of high melting point such as tungsten and polycrystal silicon doped with impurities. The PNP transistor region, on the other hand, is formed with a polycrystal silicon layer 317 doped with P-type impurities on the N-type base region 316 to form a P-type emitter region 318, and the NPN transistor region is formed with a polycrystal silicon layer 325 doped with N-type impurities on the P-type base region 324 to form a P-type emitter region 326. Further, the surfaces of the P wells 310, 311 of the nMOS region and the PNP transistor region are formed with N-type high-concentration layers 315, 319, 321 by ion implantation in a common process, thereby preparing an external base layer and a source-drain layer, respectively. The surfaces of the N wells 312, 313 of the pMOS region and the NPN transistor region, on the other hand, are formed with P-type high-concentration layers 323, 327, 329 in a common process to form an external base layer and a source-drain layer, respectively.

Figure 36:
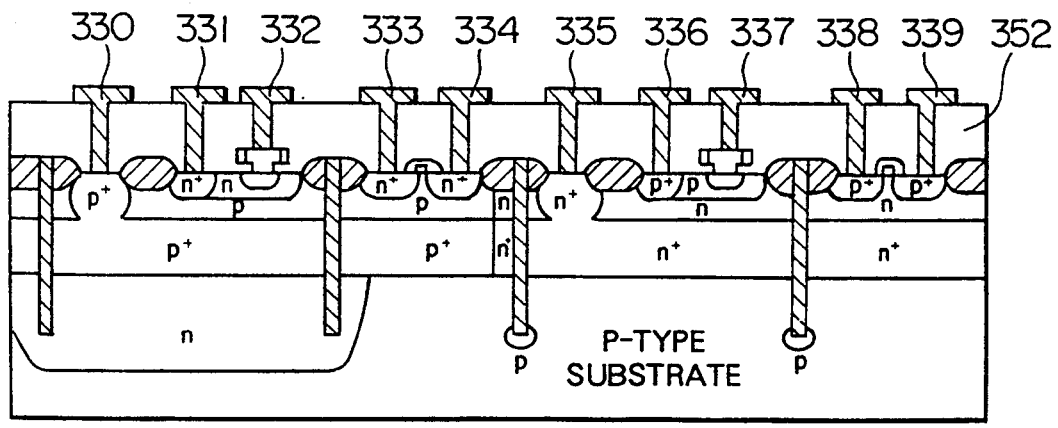
FIG. 36 is a sectional view showing a method of fabricating a device structure according to still another embodiment of the present invention.

Next, as shown in FIG. 36, the substrate surface is covered with an interlayer insulating material 352, a contact hole is opened, and metal wirings 330 to 339 are formed in the opening.

According to the present embodiment, the steps of forming the trench 303 are unified into a single process for the NPN and PNP transistors, and therefore a high-performance CBiCMOS can be produced with a comparatively small number of steps.

Figure 37:
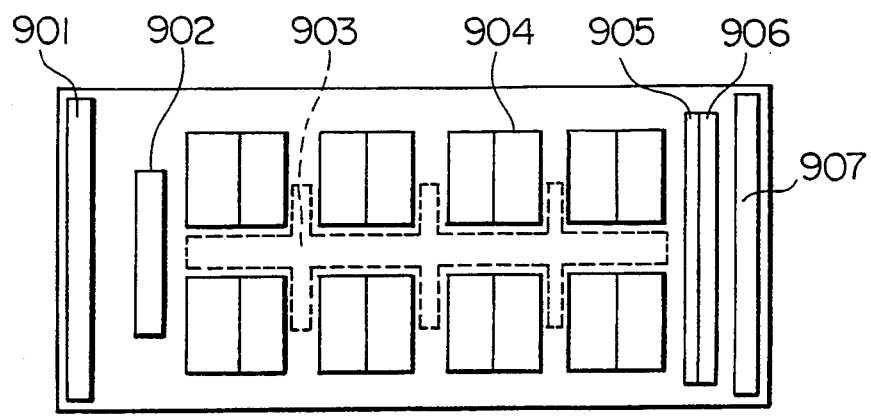
FIG. 37 is a diagram showing a configuration of static RAM to which the present invention is applied.

FIG. 37 is a diagram showing a configuration of a static RAM (SRAM) according to an embodiment of the semiconductor memory using a gate circuit of the present invention.

The SRAM includes an input pad 901 for inputting an address signal, an input buffer 902 for receiving an address signal, a decoder 903 for selecting an address on the basis of a signal from the input buffer, a memory cell 904 having a specific address for holding information, a sense amplifier 90 for amplifying the information of the memory cell, an output buffer 906 for applying the output of the sense amplifier 905 to circuits in subsequent stages, and a signal output pad 907.

A SRAM, which operable at high speed with low power consumption even when the supply voltage of the system decreases, is thus realized by applying a gate circuit according to the present invention to the input buffer circuit 902 and/or the decoder circuit 903. This is also the case with a dynamic RAM (DRAM) and a non-volatile memory. In this way, a low-voltage memory with a supply voltage of less than 2 V, or especially, with a supply voltage of less than 1.5 V and drivable with a battery, is realized.

Figure 38:
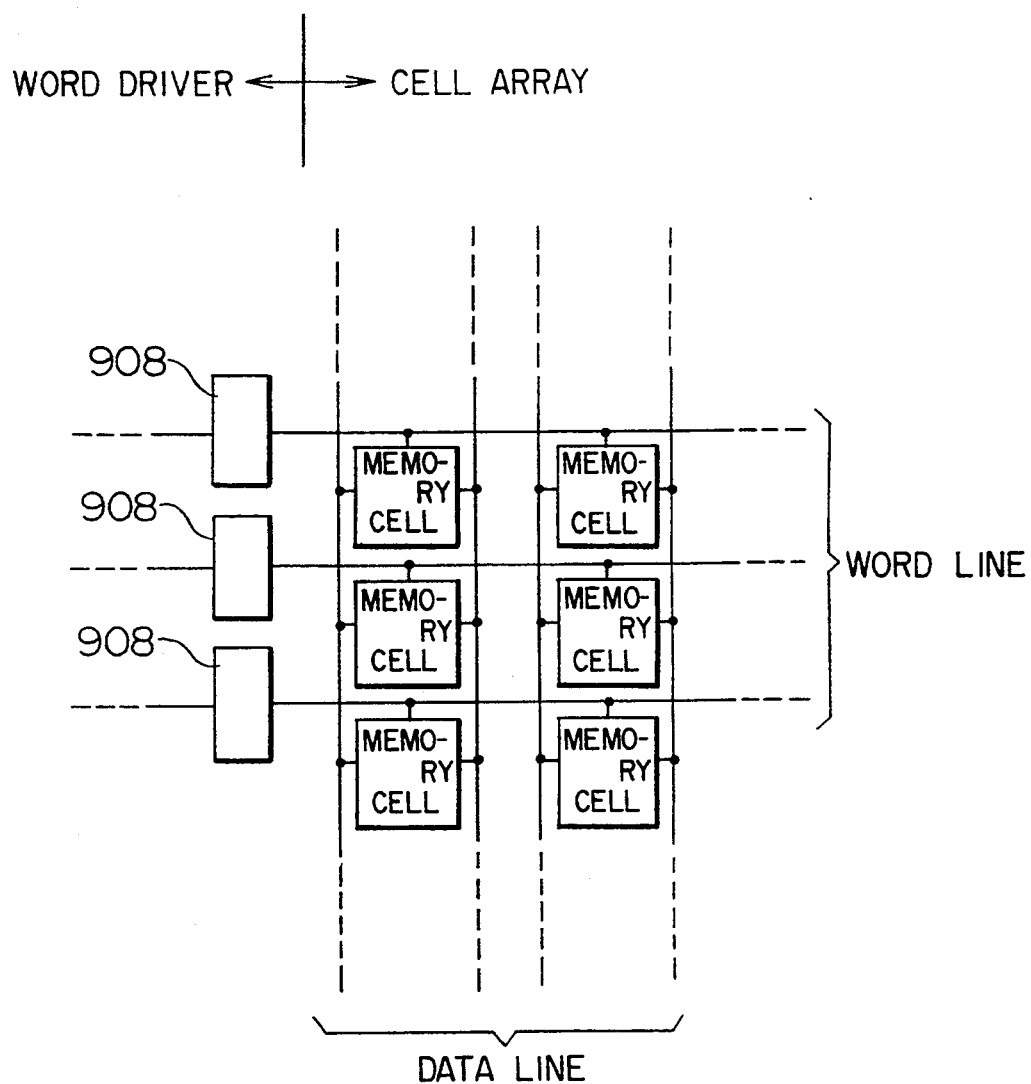
FIG. 38 is a diagram showing a configuration of a word driver of a memory according to an embodiment of the present invention.
Figure 39:
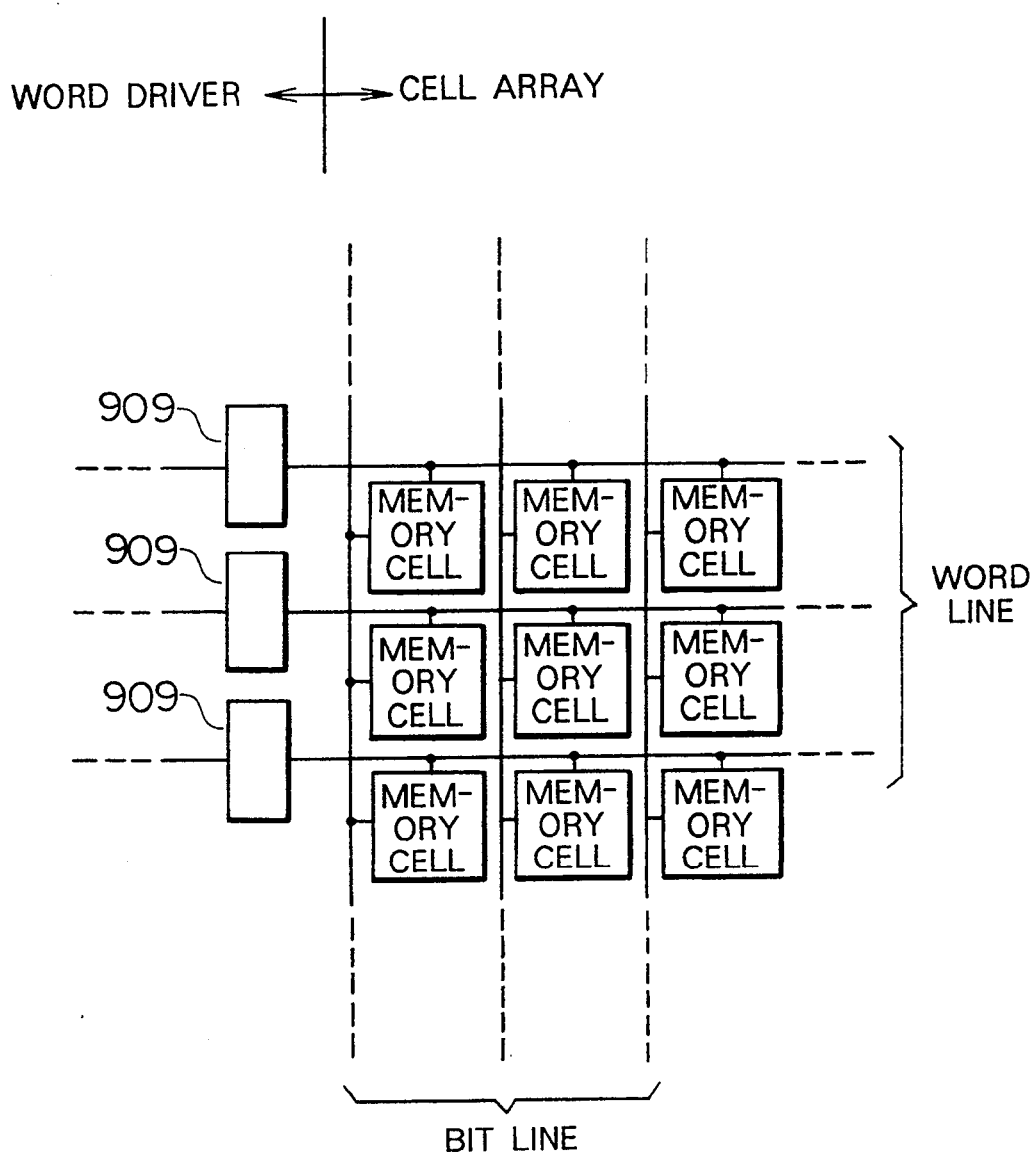
FIG. 39 is a diagram showing a configuration of a word driver of a memory according to another embodiment of the present invention.

This invention has a specially great effect in an application to the word driver making up a part of a decoder circuit. FIGS. 38 and 39 show an embodiment of the gate circuit according to the present invention as applied to the word drivers 907, 908 of the SRAM and DRAM, respectively. The word driver is a circuit which in response to a signal from a decoder circuit pulls up the potential of a word·line of a corresponding column to high level or pulls it down to low level. When the potential of the word line rises to high level, the transfer MOSFET of the memory cell begins to conduct, and a data is written or read through a data line or a bit line. In the conventional BiCMOS gate circuit, the high level is not higher than a supply voltage less Vbe. In the case of a low supply voltage, therefore, the transfer MOSFET fails to conduct sufficiently, thereby sometimes giving rise to the fear of a writing or reading failure. Also, since the low level fails to reach below the ground potential plus Vbe, the transfer MOSFET fails to cease to conduct sufficiently, thereby often undesirably rewriting the information stored in a memory cell not selected. As a result, in spite of a considerable load imposed on the word line, a CMOS gate circuit or a BiCMOS gate circuit subjected to full amplitude by a resistor has so far been used at the sacrifice of the high-speed characteristics which other wise could be enjoyed by a BiCMOS gate circuit. A gate circuit according to the present invention, by contrast, with an output in full amplitude, is applicable also to the word driver and drives the word line with a bipolar transistor having a large load driving capacity, thus making possible a high-speed memory.

Figure 40:
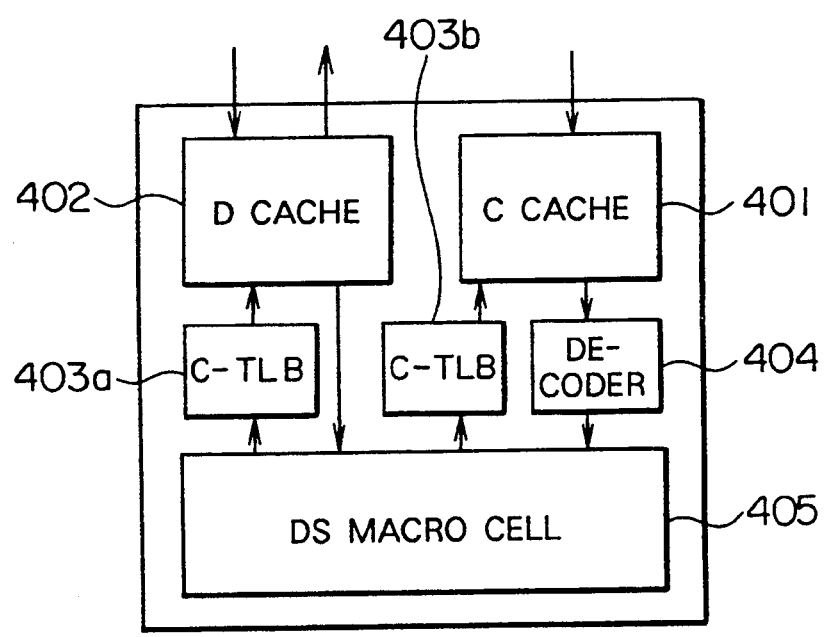
FIG. 40 is a block diagram showing a microprocessor according to the present invention.

FIG. 40 is a diagram showing a configuration of a microprocessor to,which the above-mentioned gate circuit according to an embodiment of the present invention is applied.

A microprocessor comprises, as well known, a C-cache memory 401 for receiving instructions, a decoder 404, a data structure (DS) macro cell 405 for executing and producing an arithmetic operation on the basis of an output signal of the decoder, a D-cache memory 402 for storing the processing result, a C-translation look-aside buffer (C-TLB) 403b for designating an address to read the next instruction following the arithmetic operation from the cache memory 401, and a D-TLB 403a for converting the logic address of the result of arithmetic operation into a physical address of the D-cache memory 402 and designating a data storage address.

In the microprocessor, a CMOS or BiCMOS logic gate circuit is used for the parts other than the memory cell which execute the arithmetic operation. Therefore, an application of the present invention to such parts realizes a microprocessor of low power consumption type which operates at high speed even against a reduced source voltage. Especially if the present invention is applied to the parts where a CMOS gate circuit has so far been used unavoidably in place of a BiCMOS gate circuit in spite of a heavy load due to a lack of full amplitude output, a higher operating speed is attained. In this way, a low-voltage microprocessor with a source voltage of less than 2 V is realized. It is especially possible to obtain a microprocess with a source voltage of less than 1.5 V which can be driven with a battery.

Figure 41:
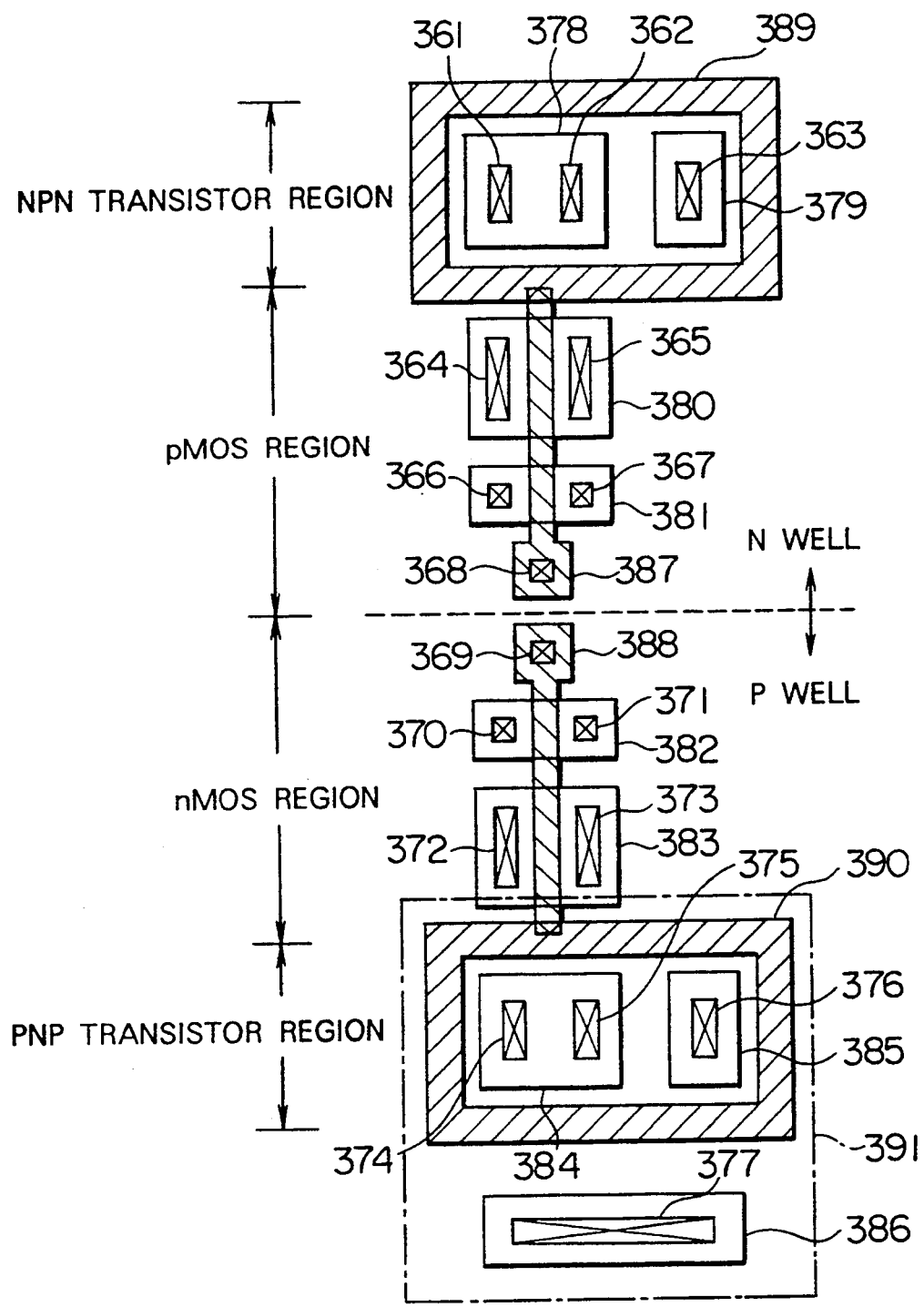
FIG. 41 is a diagram showing a layout of a BiCMOS gate circuit according to an embodiment of the present invention.

FIG. 41 shows a layout example of a BiCMOS gate circuit according to the present invention. The layout of a wiring layer is not shown to avoid confusion.

According to the present embodiment, a PNP transistor region, an nMOS region, a pMOS region and an NPN transistor region are arranged in that order, in such a manner that a PNP transistor region is not adjacent to an NPN transistor region.

As described above, the N-type buried layer for isolating the collector and the substrate of the PNP transistor from each other extends outside of the PNP transistor region. If the collector layer of the NPN transistor is not electrically isolated from the N-type buried layer, a larger collector capacitance would result. When the device structure according to the present invention is used, therefore, the NPN transistor is required be arranged at a distance from the PNP transistor. An adjacent arrangement of the NPN and PNP transistors would increase the area of the gate circuit correspondingly, thereby making it impossible to obtain a high integrity.

According to the present embodiment, an nMOS region is located adjacent to a PNP transistor region, and no problem is posed even if an N-type buried layer 391 is laid over the nMOS region. Therefore, devices can be arranged in a minimum space dependent on the processing technique, thereby saving the area of the gate circuit to a minimum. In view of the fact that a supply voltage is applied normally to the N well of the pMOS region, the PNP transistor region and the pMOS region may be arranged adjacently to each other with the N-type buried layer laid over the N well of the pMOS region to supply a potential to the N-type buried layer.

Although an embodiment has been explained above with reference to a BiCMOS device structure formed on a P-type substrate, a BiCMOS device structure may alternatively be formed on an N-type substrate to produce a similar configuration with equal effect.

A further embodiment of the present invention will be described with reference to the accompanying drawings.

Figure 44:
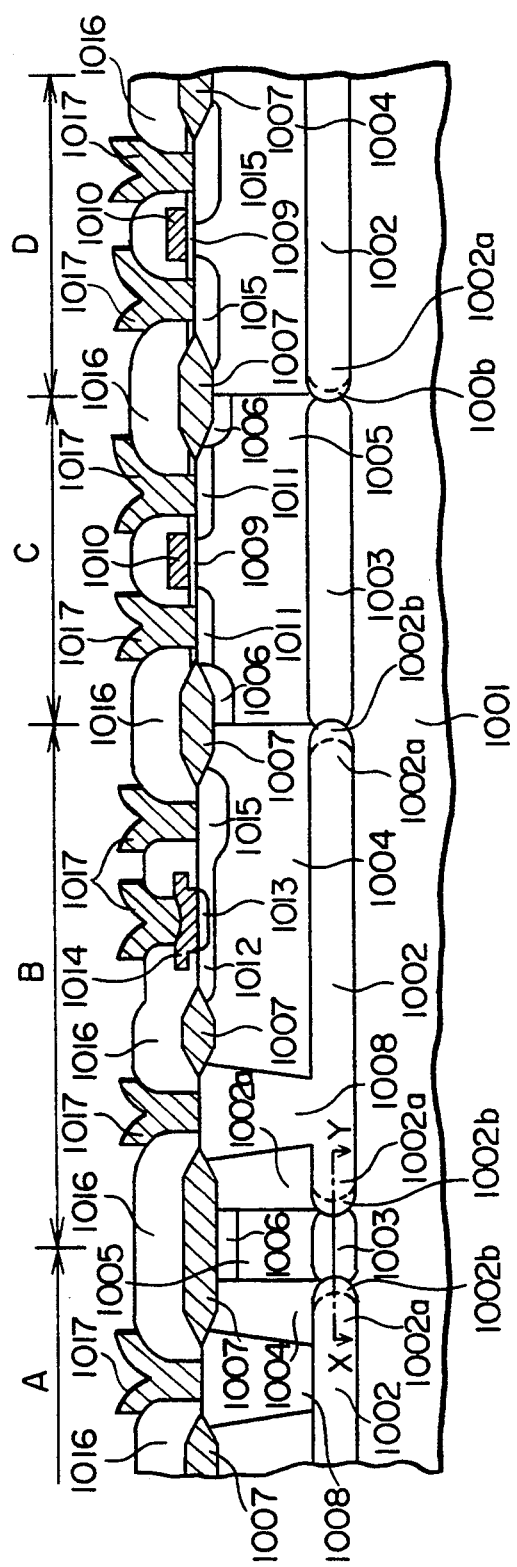
FIG. 44 is a sectional view showing the structure of a semiconductor integrated circuit device according to an embodiment of the present invention.
Figure 48:
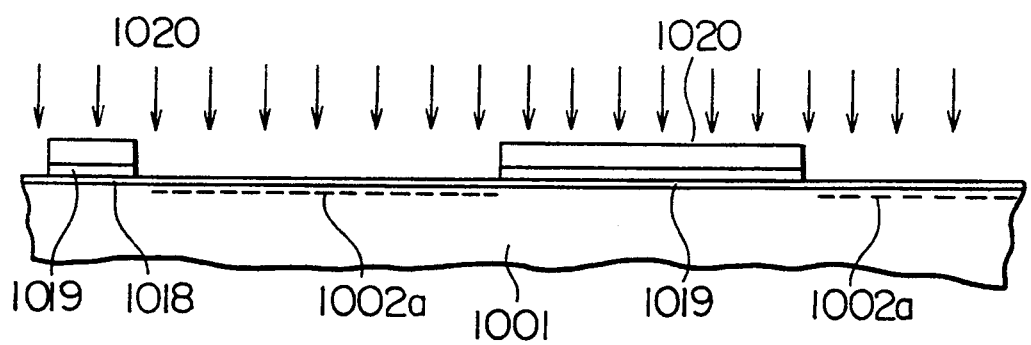
FIG. 48 shows a sectional configuration of a semiconductor integrated circuit device in the step following that of FIG. 47.
Figure 49:
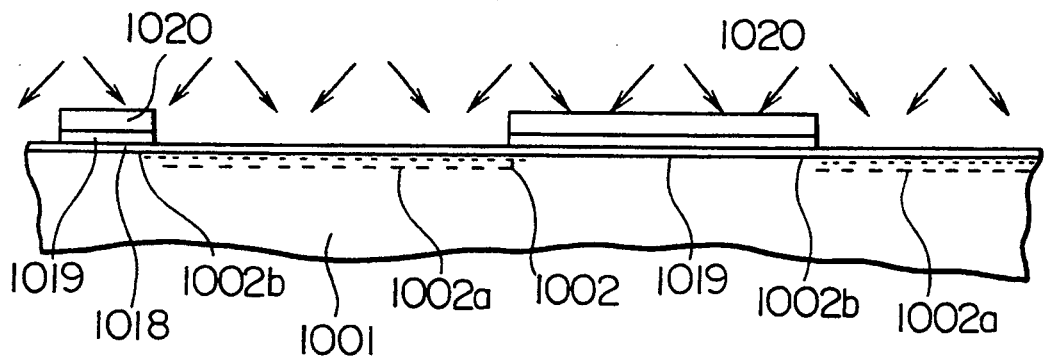
FIG. 49 shows a sectional configuration of a semiconductor integrated circuit device in the step following that of FIG. 48.

FIG. 44 is a diagram showing a sectional view of an integrated circuit device structure comprising a bipolar transistor, an N-channel MOS transistor and a P-channel MOS transistor formed on a single silicon substrate. In FIG. 44, a portion of a bipolar transistor is formed at a part A, a bipolar transistor at a part B, an N-channel MOS transistor at a part C, and a P-channel MOS transistor at a part D. Reference numeral 1001 designates a P-type silicon substrate, numeral 1002 an N+ buried layer, numeral 1003 a P+ buried layer, numeral 1004 an N-type region, numeral 1005 a P-type region, numeral 1006 a P-type region, numeral 1007 a silicon oxide film, numeral 1008 an N+ region, numeral 1009 a gate oxide film, numeral 1010 a gate electrode, numeral 1011 an N+ region, 1012 a base region, 1013 an emitter region, 1014 an emitter polycrystal silicon electrode, numeral 1015 a P+ region, numeral 1016 an interlayer insulating film, numeral 1017 a metal film, numeral 1018 a silicon oxide film, numeral 1019 a silicon nitride film, and numeral 1020 a photoresist film. The numerals 1018, 1019 and 1020 are shown in FIGS. 48 and 49.

Figure 45:
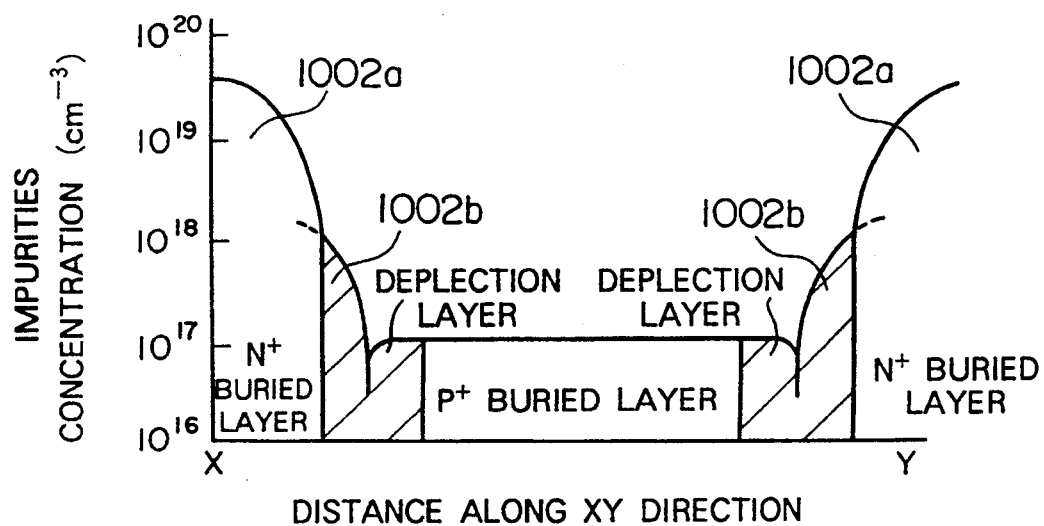
FIG. 45 is a schematic diagram showing an impurities concentration distribution along a X-Y curve shown in FIG. 44.

As shown in FIG. 45, the concentration gradient of the impurities concentration distribution in a direction lateral of the N+ buried layers making up the collectors of the bipolar transistors A and B (in the direction perpendicular to the junction between the N+ and P+ buried layers) is arranged in double stages of a distribution 1002a for higher concentration and a distribution 1002b for lower concentration. By doing so, the lower concentration distribution 1002b of the double-stage concentration gradient forms a PN junction with a P+ buried layer, so that the depletion layer of the PN junction extends to reduce the junction capacitance. As a consequence, the parasitic capacitance of the bipolar transistor and the substrate is reduced and a high-speed operation of a semiconductor integrated circuit device realized.

Figure 46:
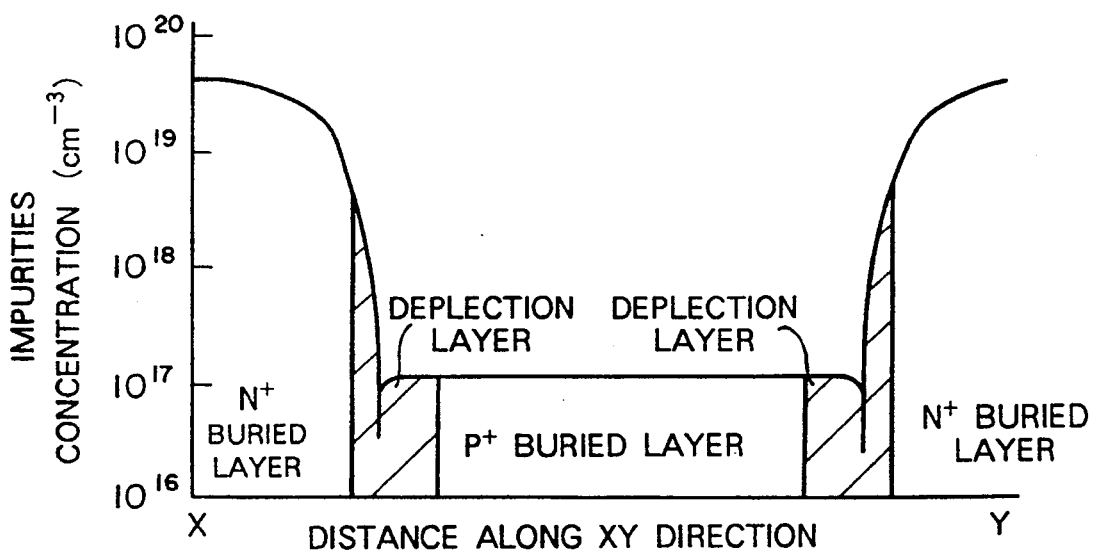
FIG. 46 is a schematic diagram showing an impurities concentration distribution corresponding to FIG. 45 according to the prior art.

FIG. 46 shows an impurities concentration distribution of N+ and P+ buried layers, of which the former is formed by self-aligning according to the prior art. Since N+ and P+ of high concentration make up a PN junction, the depletion layer is shallow and the junction capacitance high.

Now, explanation will be made about a method of fabricating the semiconductor integrated circuit device shown in FIGS. 44 and 45.

Figure 47:
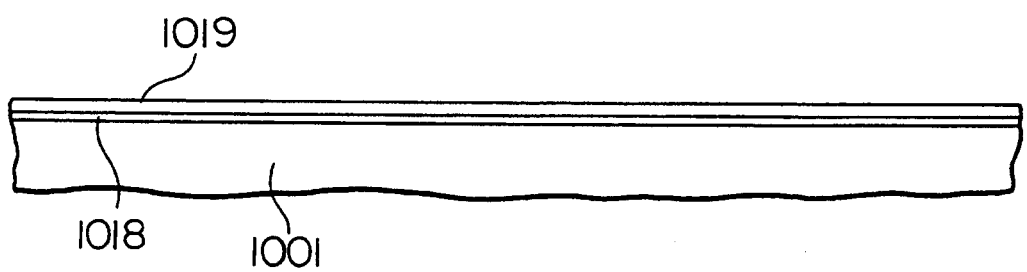
FIG. 47 shows a sectional configuration of a semiconductor integrated circuit device according to the present invention in a certain production step.

FIGS. 47 to 52 show sectional views of representative fabrication processes. In FIG. 47, a P-type silicon substrate 1 having a specific resistance of about 10 $\Omega$·cm has formed thereon a thermally oxidized silicon film 1018 of 10 to 500 nm and a nitrized silicon film 1019 of 10 to 500 nm. As the next step, as shown in FIG. 48, in order to form an N+ buried layer, the portion of the nitrized silicon film in a region where a bipolar transistor and a pMOS transistor are prepared is etched by the photoresist technique and the existing dry etching technique. With the remaining photoresist 1020 and the nitride silicon film 1019 as a mask, N-type impurities such as antimony (Sb) are introduced into the silicon substrate 1001 to the degree of 1 to $5 \times 10^{15}$ cm$^2$ by ion implantation. In FIG. 49, in order to form a concentration gradient of the impurities concentration distribution of the N+ buried layer in double stages of high and low distributions 1002a and 1002b, antimony of about $10^{13}$ to $10^{15}$ is introduced into the silicon substrate 1001 at an angle of, say, 30° to 60°.

It is possible to obtain the above-mentioned impurities concentration distribution also in the manner mentioned below even in the case where the oblique ion implantation described above is not practicable. As an example, the ion implantation in FIG. 48 is followed by removal of photoresist, and a side spacer of nitride silicon or an oxide silicon film is formed at an end of the nitrized silicon film 1019 for another ion implantation. In the process, the first ion implantation is effected with a low concentration. As the next step, the photoresist is removed to form a P+ buried layer, and selective oxidization is effected with the remaining nitride film as a mask thereby to form a thermally oxide film of 300 to 500 nm. After that, the nitride film is removed, and boron (B) making up P-type impurities is introduced into the substrate by about 1 to $5 \times 10^{13}$ cm$^2$ by ion implantation with the selectively-oxidized film as a mask.

The embodiment described above, in which impurities of the P+ buried layer are not introduced with the photoresist as a mask, is suitable for high integration.

Figure 50:
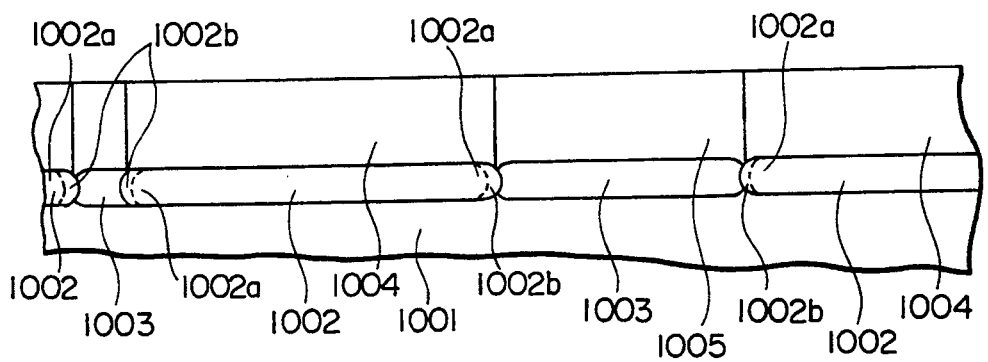
FIG. 50 shows a sectional configuration of a semiconductor integrated circuit device in the step following that of FIG. 49.

In FIG. 50, the oxide film used for ion implantation is removed by the existing etching technique, and a single crystal silicon film 0.5 to 1.5 μm thick is formed by epitaxial growth. At the same time, the N+ buried layer 1002 is formed in a region where a bipolar transistor and a P-channel MOS transistor are prepared, and the P+ buried layer 1003 in other regions.

As the next step, a silicon oxide film and a silicon nitride film are formed to the thickness of 10 to 500 nm on a single crystal silicon. The silicon nitride film is etched off by use of the photoresist and dry etching techniques from the region where a bipolar transistor and a P-channel MOS transistor are prepared. With this photoresist and the silicon nitride film as a mask, about 1 to $10 \times 10^{12}$ cm$^2$ of phosphorus (p) making up N-type impurities is formed by ion implantation. The photoresist that has been used as a mask is removed, and selective oxidization is effected with the remaining silicon nitride film as a mask thereby to form a silicon oxide film of 50 to 500 nm. The silicon nitride film is then removed, and with the selectively-oxidized silicon oxide film as a mask, boron (B) making up P-type impurities is introduced by ion implantation to the depth of about 1 to $10 \times 10^{13}$ cm$^2$. The resulting assembly is subjected to heat treatment at about 1000° C. for about one hour thereby to form an N-type region 1004 and a P-type region 1005 with the impurities concentration of $10^{15}$ to $10^{17}$ cm$^3$ to the depth of 1 or 2 μm below the surface. The remaining silicon oxide film is removed.

Figure 51:
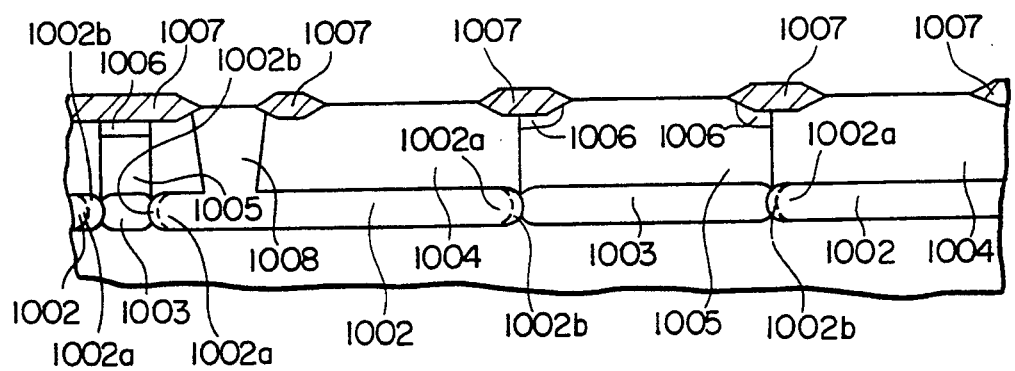
FIG. 51 shows a sectional configuration of a semiconductor integrated circuit device in the step following that of FIG. 50.

Further, in FIG. 51, in order to electrically isolate the devices formed on a single crystal silicon from each other, a silicon oxide film 1007 is formed between the devices to the thickness of 100 to 1000 nm by the above-mentioned selective oxidation method. In the process, in order to secure electrical isolation of the devices formed in the P-type region 1005, a P-type region 1006 having an impurities concentration of about $10^{16}$ to $10^{17}$ cm$^3$ is formed immediately under the silicon oxide film 1007 of the P-type region 1005. As the next step, in order to take out an electrode from the surface of the collector of the bipolar transistor, impurities phosphorus (p) which is to form an N+ region is introduced by about $10^{15}$ cm$^2$ by photoresist and ion implantation techniques to form the N+ region 1008, and is subjected to heat treatment for about 30 minutes at 1000° to assure contact with the N+ buried layer.

Figure 52:
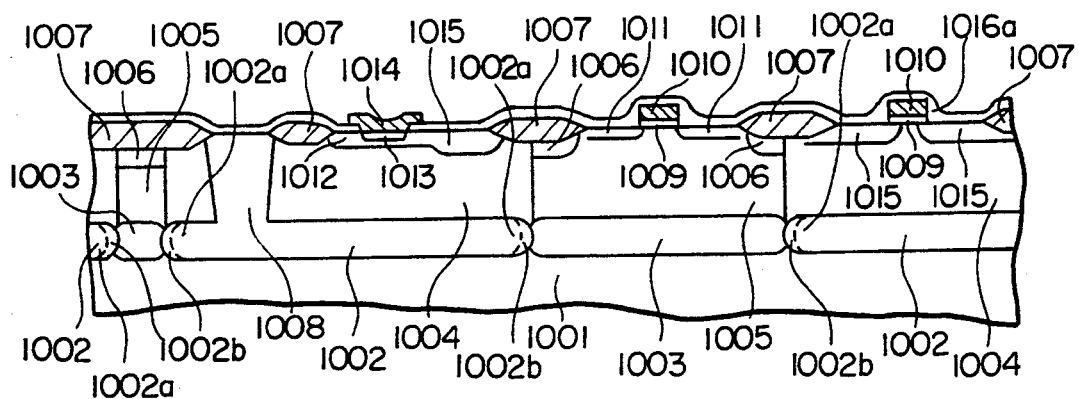
FIG. 52 shows a sectional configuration of a semiconductor integrated circuit device in the step following that of FIG. 51.

Then, in Fig. 52, first, in order to form a gate oxide film 1009 of a MOS transistor, a silicon oxide film is formed to the thickness of 5 to 50 nm by thermal oxidization. By using the chemical vapor deposition, polycrystal silicon is deposited and N-type impurities introduced in order to reduce the resistance. After that, photoresist is left at parts where it is desired to form a gate electrode of the MOS transistor by the photoresist technique, and the polycrystal silicon is etched off with the remaining photoresist as a mask to produce a gate electrode 1010 by the existing dry etching technique.

As the next process, in order to form a source-drain region of an N-channel MOS transistor, the resist on the P-type region 1005 formed with an N-type MOS transistor is removed by the photoresist technique, and an N+ region 1011 is formed by ion implantation of phosphorus (p) or arsenic (As) making up N-type impurities over an area of $10^{14}$ to $10^{16}$ cm$^2$.

In order to form the base of the bipolar transistor, the resist is removed from the area where it is desired to form the base, in the same manner as mentioned above, and boron making up P-type impurities is implanted over an area of 5 to $10 \times 10^{13}$ cm$^2$ to form a base region 1012, followed by heat treatment at 800° to 1000° C. for securing a junction depth of 100 to 500 nm of the base region. The resist is removed from the surfaces of the region where the base region is in contact with the wiring metal film and the N-type region 1004 formed with a P-type MOS transistor, and boron (B) providing N-type impurities is implanted over an area $10^{15}$ to $10^{16}$/cm$^2$ to form the P+ region $10^{15}$.

Further, in order to form the emitter of the bipolar transistor, a silicon oxide is deposited to the thickness of 10 to 1000 nm by chemical vapor deposition, and the silicon oxide film at a part where the emitter is to be formed is opened by photoresist and dry etching techniques. After that, polycrystal silicon is deposited by the above-mentioned method, and in order to form the emitter region 1013, phosphorus (p) or arsenic (As) providing N-type impurities is implanted by the ion implantation technique over an area of $10^{15}$ to $5 \times 10^{16}$/cm$^2$, followed by heat treatment at 800° to 1000° C. to secure a junction depth of 50 to 200 nm of the emitter region thereby to form an emitter region 1013. The polycrystal silicon used for forming an emitter region is processed into a predetermined shape, thus producing an emitter polycrystal silicon electrode 1014.

Finally, in order to produce a wiring metal film, an interlayer insulating film 1016 is formed of a silicon oxide, and the portion of each device where it is desired to connect the metal film is formed with a contact hole. A metal film of aluminum or the like is deposited, and processed into shape to produce a metal film 1017. The fabrication processes mentioned above make it possible to fabricate a semiconductor integrated circuit device as shown in FIGS. 44 and 45.

Figure 53:
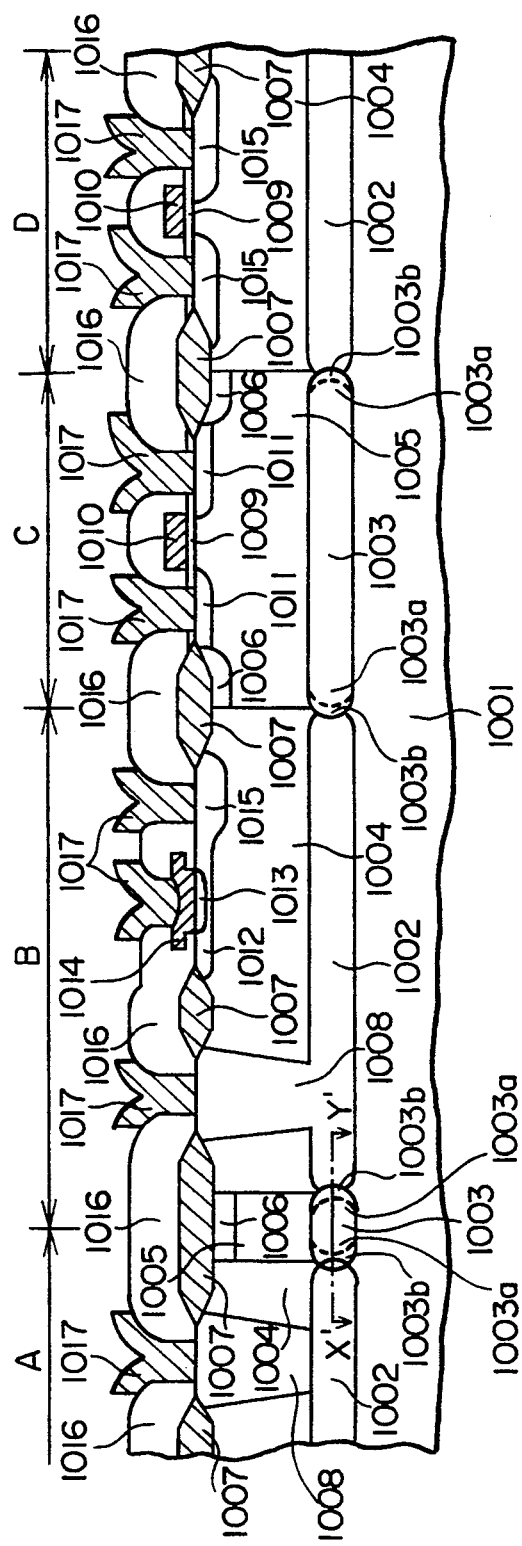
FIG. 53 shows a sectional configuration of a semiconductor integrated circuit device according to another embodiment of the present invention.
Figure 54:
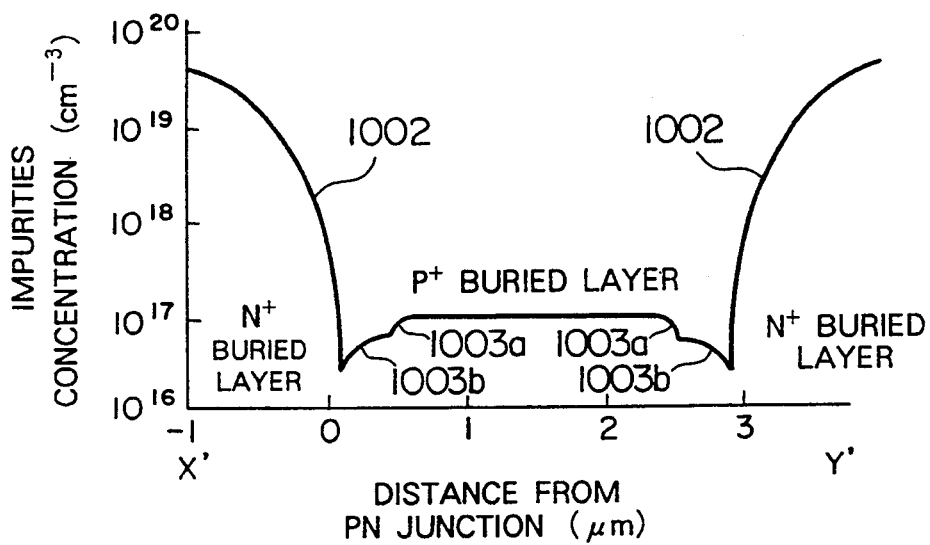
FIG. 54 is a schematic diagram showing an impurities concentration distribution along the X'-Y' curve shown in FIG. 53.

FIG. 53 is a sectional view of a still further embodiment of the present invention applied to an N+ buried layer. FIG. 54 shows an impurities concentration distribution along the X'-Y' curve in FIG. 53. As shown in FIG. 54, the concentration gradient of the impurities concentration distribution in the horizontal direction of the P+ buried layer making up the collectors of the bipolar transistors A, B (the direction perpendicular to the junction plane between the P+ and N+ buried layers) is constructed in double stage of a high concentration 1003a and a low concentration 1003b. This configuration leads to the same effect as in the above-mentioned embodiment.

Figure 55:
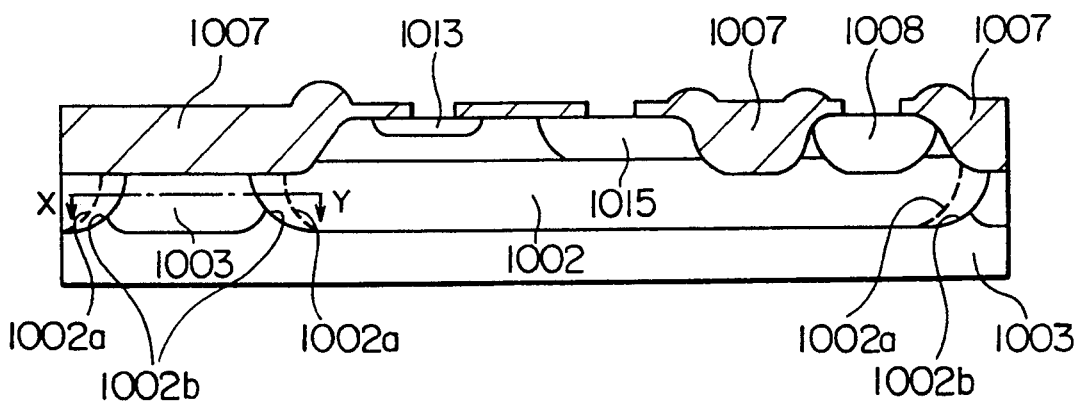
FIG. 55 shows a sectional configuration of a semiconductor integrated circuit device according to still another embodiment of the present invention.

FIG. 55 shows still another embodiment of the present invention as an example applied to a bipolar transistor of isoplanar type. A bipolar transistor of isoplanar type, which has a field oxide film 7 not protruded upward, permits the surface of a semiconductor integrated circuit to be flattened. An impurities concentration distribution similar to the one in FIG. 45 is obtained in the line component X-Y shown, thereby producing the same effect as in the embodiment of FIG. 45.

Figure 56:
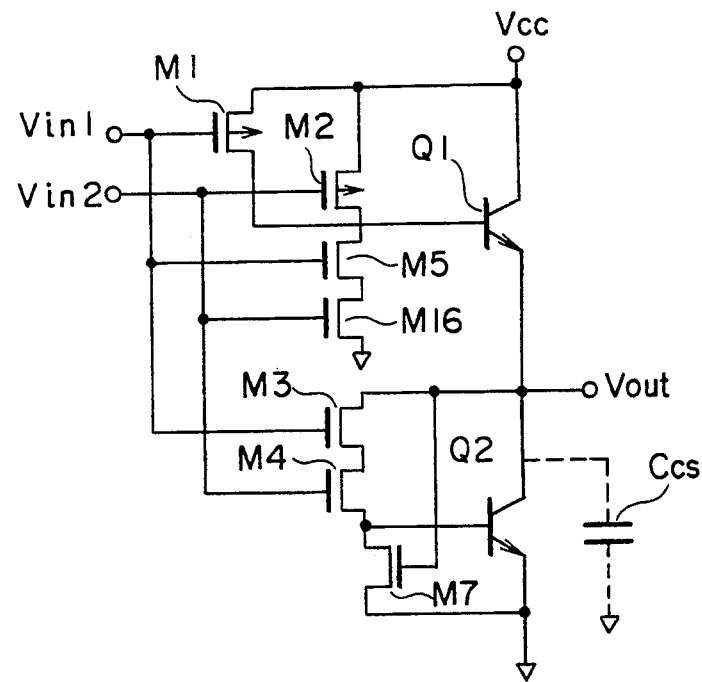
FIG. 56 shows a two-input NAND gate circuit to which a semiconductor integrated circuit device according to the present invention is applied.
Figure 57:
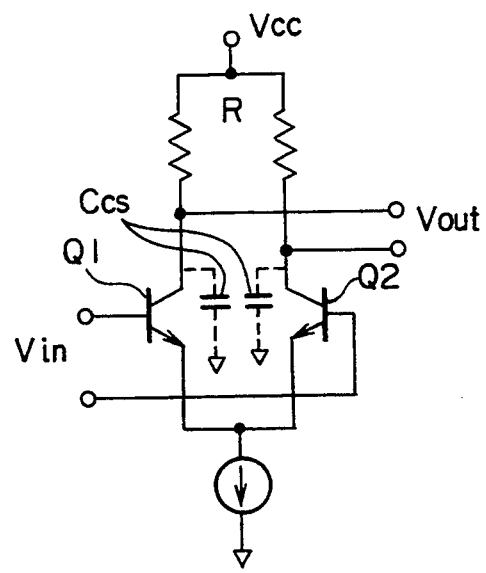
FIG. 57 is a diagram showing a differential amplifier as an example of application.

FIG. 56 shows a typical circuit to which a semiconductor integrated circuit device according to the present invention is actually applied. This device is a two-input NAND gate circuit. In FIG. 56, M1, M2 designate a P-channel MOS transistor, M3 to M7 an N-channel MOS transistor, Q1, Q2 an NPN bipolar transistor. Between the base of the bipolar transistors Q1, Q2 and the ground, N-channel MOS transistors M5, M6, M7 are connected for changing the resistance between the base and the ground by a control signal. According to this embodiment, the parasitic capacitance Ccs of the substrate and the collector of the bipolar transistor shown is reduced. FIG. 57 shows a circuit diagram of a typical differential amplifier circuit to which the present embodiment is actually applied.

We claim:

1. A method of fabricating a semiconductor integrated circuit device, comprising:
   a first step of forming a thermal oxide film on a silicon substrate and a nitride film on the thermal oxide film,
   a second step of coating a photoresist, and removing the photoresist and the nitride film from a position where an N+ buried layer or a P+ buried layer is to be formed;
   a third step of implanting impurities as ions for forming either the N+ buried layer or the P+ buried layer at the position where the N+ buried layer or the P+ buried layer is to be formed, and forming the N+ buried layer or the P+ buried layer; and
   a fourth step of implanting additional impurities of the same conductivity type as said impurities as ions, at a concentration lower than at said third step, at an angle to said silicon substrate, said angle being in the range of 30° to 60°, so as to form an additional buried layer adjacent the N+ buried layer or the P+ buried layer, of the same conductivity type as the N+ buried layer or the P+ buried layer, but of a lower impurity concentration than that of the N+ buried layer or the P+ buried layer.

2. A method of fabricating a semiconductor integrated circuit device according to claim 1, including the further step of epitaxially growing a semiconductor layer on the N+ buried layer or P+ buried layer.

3. A method of fabricating a semiconductor integrated circuit device according to claim 2, wherein said position is a position where an N+ buried layer is to be formed, said impurities being N-type impurities for forming said N+ buried layer, and wherein said additional buried layer is an additional N-type buried layer.

4. A method of fabricating a semiconductor integrated circuit device according to claim 1, wherein said position is a position where an N+ buried layer is to be formed, said impurities being N-type impurities for forming said N+ buried layer, and wherein said additional buried layer is an additional N-type buried layer.

5. A method of fabricating a semiconductor integrated circuit device according to claim 1, comprising the further step of forming a buried layer of opposite conductivity type of the N+ buried layer or P+ buried layer, at a location adjacent the additional buried layer, the additional buried layer being located between (a) the N+ buried layer or P+ layer and (b) the buried layer of opposite conductivity type.

6. A method of fabricating a semiconductor integrated circuit device, comprising:
   a first step of forming a thermal oxide film on a silicon substrate and a nitride film on the thermal oxide film;
   a second step of coating a photoresist, and removing the photoresist and said nitride film from the position where an N+ buried layer is to be formed;
   a third step of implanting N-type impurities as ions for forming an N+ buried layer at said position;
   a fourth step of implanting N-type impurities as ions at a concentration lower than at said third step, at an angle to the silicon substrate;
   a fifth step of removing the remaining photoresist, forming a selective oxide film over said N+ buried layer, removing the remaining nitride film, and implanting P-type impurities as ions in order to form a P+ buried layer using said selective oxide film as a mask;
   a sixth step of removing the selective oxide film and forming a single crystal silicon by epitaxial growth;
   a seventh step of forming an N-type region in an area where a bipolar transistor and a P-channel MOS transistor are to be formed, and forming a P-type region in an area where an N-channel MOS transistor is to be formed; and
   an eighth step of forming a field oxide film for isolating said bipolar transistor, said P-channel MOS transistor and said N-channel MOS transistor from each other.

7. A method of fabricating a semiconductor integrated circuit device according to claim 6, wherein said N+ buried layer formed in said third step forms a high-concentration collector buried layer of said bipolar transistor, of NPN type.

8. A method of fabricating a semiconductor integrated circuit device according to claim 6, wherein said N-type impurities implanted in said third step and said N-type impurities implanted in said fourth step are the same impurities.

9. A method of fabricating a semiconductor integrated circuit device, comprising:
   a first step of forming a thermal oxide film on a silicon substrate and a nitride film on the thermal oxide film,
   a second step of coating a photoresist, and removing the photoresist and the nitride film from a position where an N+ buried layer is to be formed;
   a third step of implanting impurities as ions for forming either the N+ buried layer or the P+ buried layer at the position where the N+ buried layer or the P+ buried layer is to be formed, and forming the N+ buried layer or the P+ buried layer, wherein said semiconductor integrated circuit device includes a bipolar transistor, and the N+ buried layer or P+ buried layer forms a high-concentration collector buried layer of the bipolar transistor; and
   a fourth step of implanting additional impurities of the same conductivity type as said impurities as ions, at a concentration lower than at said third step, at an angle to said silicon substrate, said angle being in the range of 30° to 60°, so as to form an additional buried layer adjacent the N+ buried layer or the P+ buried layer, of the same conductivity type as the N+ buried layer or the P+ buried layer but of a lower impurity concentration than that of the N+ buried layer or the P+ buried layer.

10. A method of fabricating a semiconductor integrated circuit device according to claim 9, including the further step of epitaxially growing a semiconductor layer on the N+ buried layer or P+ buried layer.

11. A method of fabricating a semiconductor integrated circuit device according to claim 10, wherein said position is a position where an N+ buried layer is to be formed, said impurities being N-type impurities for forming said N+ buried layer, and wherein said additional buried layer is an additional N-type buried layer.

12. A method of fabricating a semiconductor integrated circuit device according to claim 69, wherein said position is a position where an N+ buried layer is to be formed, said impurities being N-type impurities for forming said N+ buried layer, and wherein said additional buried layer is an additional N-type buried layer.

13. A method of fabricating a semiconductor integrated circuit device according to claim 9, comprising the further step of forming a buried layer of opposite conductivity type to the N+ buried layer or P+ buried layer, at a location adjacent the additional buried layer, the additional buried layer being located between (a) the N+ buried layer or P+ buried layer and (b) the buried layer of opposite conductivity type.

* * * * *